United States Patent
Markle

(10) Patent No.: US 9,645,496 B2
(45) Date of Patent: May 9, 2017

(54) MASKLESS DIGITAL LITHOGRAPHY SYSTEMS AND METHODS WITH IMAGE MOTION COMPENSATION

(71) Applicant: David A. Markle, Pleasanton, CA (US)

(72) Inventor: David A. Markle, Pleasanton, CA (US)

(*) Notice: Subject to any disclaimer, the term of this patent is extended or adjusted under 35 U.S.C. 154(b) by 41 days.

(21) Appl. No.: 14/809,501

(22) Filed: Jul. 27, 2015

(65) Prior Publication Data

US 2016/0085156 A1 Mar. 24, 2016

Related U.S. Application Data

(60) Provisional application No. 62/034,981, filed on Aug. 8, 2014.

(51) Int. Cl.
*G03B 27/54* (2006.01)
*G03F 7/20* (2006.01)

(52) U.S. Cl.
CPC .......... *G03F 7/2051* (2013.01); *G03F 7/2022* (2013.01); *G03F 7/70291* (2013.01); *G03F 7/70358* (2013.01)

(58) Field of Classification Search
CPC ............... G03F 7/72022; G03F 7/2051; G03F 7/70011; G03F 7/70425
USPC ........................................ 355/52, 55, 67–71
See application file for complete search history.

(56) References Cited

U.S. PATENT DOCUMENTS

| | | |
|---|---|---|
| 5,691,541 A | 11/1997 | Ceglio et al. |
| 6,556,279 B1 | 4/2003 | Meisburger et al. |
| 6,753,947 B2 | 6/2004 | Meisburger et al. |
| 6,870,554 B2 | 3/2005 | Jain |
| 6,977,718 B1 | 12/2005 | LaFontaine |
| 7,190,434 B2 | 3/2007 | Gui et al. |
| 7,403,266 B2 | 7/2008 | Bleeker et al. |
| 7,423,732 B2 | 9/2008 | Lipson et al. |
| 8,009,269 B2 | 8/2011 | Troost et al. |
| 8,009,270 B2 | 8/2011 | Desmedt et al. |
| 8,642,232 B2 | 2/2014 | Markle et al. |
| 2008/0013097 A1* | 1/2008 | E. del Puerto ...... G03F 7/70041 356/500 |
| 2008/0198354 A1* | 8/2008 | Smirnov ............. G03F 7/70066 355/67 |

* cited by examiner

*Primary Examiner* — Hung Henry Nguyen
(74) *Attorney, Agent, or Firm* — Opticus IP Law PLLC

(57) ABSTRACT

Maskless digital lithography systems and methods with image motion compensation are disclosed. The systems include an illuminator, an image transducer and a scanning device, wherein the transducer can be upstream or downstream from the scanning device. The illuminator provides illumination light that is modulated by the image transducer. The scanning device, illuminator and image transducer are operated in synchrony so that an image formed in a photoresist layer on a moving substrate forms a photoresist pattern that is not substantially smeared.

21 Claims, 24 Drawing Sheets

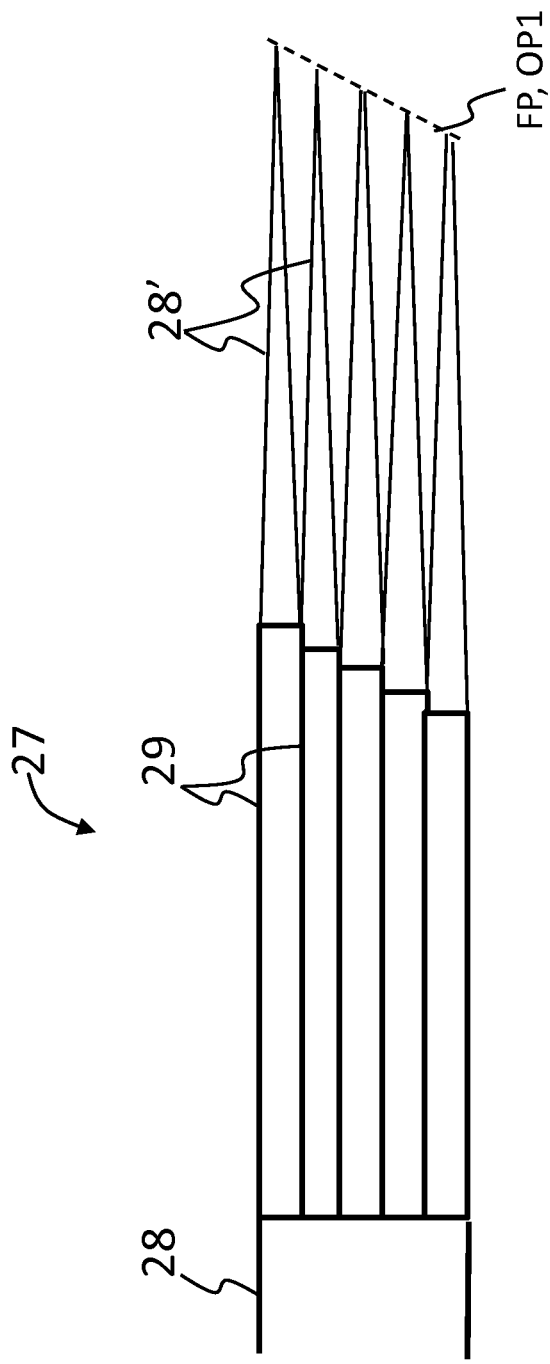

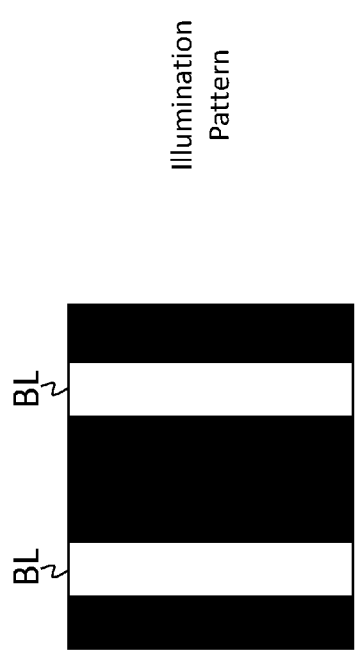
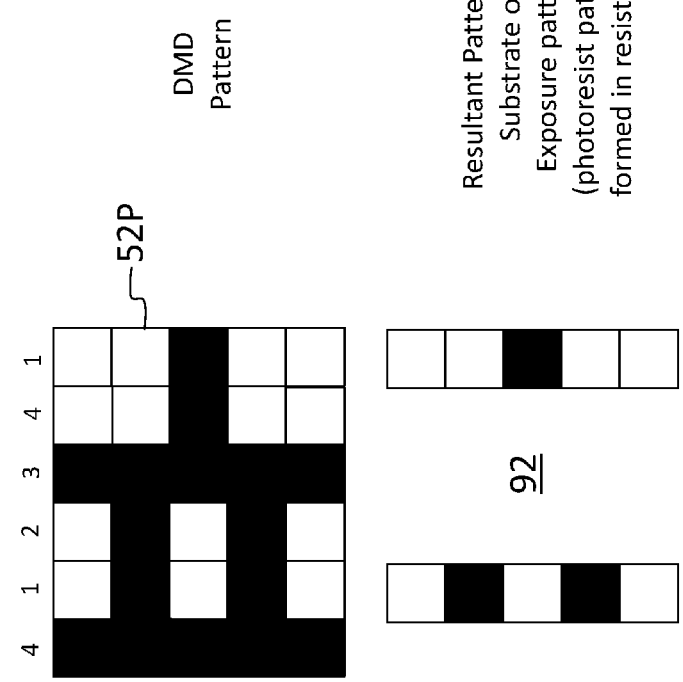
FIG. 4A  FIG. 4B  FIG. 4C

Linearity Possible with 32 Gray Levels

Slit Image Profile

MASKLESS DIGITAL LITHOGRAPHY SYSTEMS AND METHODS WITH IMAGE MOTION COMPENSATION

CROSS-REFERENCE RELATED APPLICATIONS

This application claims the benefit of priority under 35 U.S.C. §119(e) of U.S. Provisional Patent Application Ser. No. 62/034,981, filed on Aug. 8, 2014, and which is incorporated by reference herein.

FIELD

This disclosure relates to digital lithography systems and methods and in particular to such systems and methods having image motion compensation.

Any reference cited herein is incorporated by reference herein, including the following: U.S. Pat. No. 5,691,541, entitled MASKLESS RETICLE-FREE LITHOGRAPHY, by Natale M. Ceglio and David A. Markle, filed Nov. 25, 1997, which describes how an image transducer, a flashing light source, and a scanned substrate can be combined to do lithography; U.S. Pat. No. 6,556,279, entitled MOTION COMPENSATION SYSTEM AND METHOD FOR LITHOGRAPHY, by Dan Meisburger and David A. Markle, filed Aug. 20, 2001, which describes how an oscillating mask and a flashing light source can compensate for the motion of scanned substrate and result in much reduced image blur; U.S. Pat. No. 6,753,947, entitled LITHOGRAPHY SYSTEM AND METHOD FOR DEVICE MANUFACTURE, by Dan Meisburger and David A. Markle, filed May 10, 2001, which describes a Flash-on-the-fly lithography system, which does not have image motion compensation; and U.S. Pat. No. 8,642,232 to Markle et al., entitled APPARATUS AND METHOD OF DIRECT WRITING WITH PHOTONS BEYOND THE DIFFRACTION LIMIT.

BACKGROUND

The process of manufacturing certain micro-devices such as semiconductor integrated circuits (ICs), liquid crystal displays, micro-electro-mechanical devices (MEMs), digital mirror devices (DMDs), silicon-strip detectors and like involves the use of high-resolution lithography systems. Recently, there has been increased emphasis on digital lithography systems that rely on digital imaging systems to meet the increasing demands on achieving greater resolution and greater flexibility. A digital imaging system does not rely on the use of a mask but instead relies on an image transducer or spatial light modulator, such as a DMD, to define the image. For these reasons, the technology is referred to as "maskless digital lithography."

Digital imaging systems are inherently slower that their step-and-scan and step-and repeat counterparts because their field sizes are much smaller and the image transducer is stationary. In an effort to compensate for this disadvantage, such systems are operated so that the exposure time for a single frame is very short and the number of frames containing repeating parts of the pattern is large.

It would be advantageous to lengthen the maximum single frame exposure time and reduce the number of frames requiring the same parts of the pattern. This would result in a more efficient use of the illumination light and a higher throughput.

SUMMARY

This disclosure relates to digital lithography systems and methods, and in particular to image motion compensation systems and methods for a maskless digital lithography system. Aspects of the disclosure include maskless digital lithography systems and methods that include the image motion compensation systems and methods disclosed herein.

Disclosed herein are systems for and methods of achieving high-resolution imagery on a scanned substrate using a fixed image transducer, a flashing light source, and a resonant scanning mirror, such as those made by Electro-optical Products Corp. in Ridgewood, N.Y. 11385.

The resonant scanning mirror is employed to synchronize the motion of the digital image with that of the substrate during a short exposure period. The sinusoidal scanning motion of a resonant mirror allows synchronization of the transducer image with the motion of the substrate independent of the direction of the substrate motion. This is not the case with a rotating mirror. Two basic configurations are disclosed. The first employs the resonant scanning mirror between the image transducer and the substrate. The second configuration employs the resonant scanner between the light source and the image transducer, or an electro-optical device in a similar position.

In the examples described herein, the image transducer (or spatial light modulator) is sometimes assumed by way of example to be the Texas Instruments 1080p digital micromirror array, which contains 2M mirrors (which define a corresponding 2M pixels) arranged in a 1080 by 1920 array with a mirror-to-mirror spacing of 10.8 microns. The maximum frame rate of this device is about 20,000 frames/s. When operated at the maximum frame rate, the 50 μs frame time is split about evenly between useful exposure time and pixel flipping.

Two different ways of compensating for the continuous motion of a scanned substrate, which is patterned with a fixed DMD, are described. In one case, a scanning mirror located between the DMD and the substrate is used to move the DMD image in synchronism with the substrate. In the second case, portions of the pattern to be scanned are duplicated in multiple rows on the DMD and each multiple row is illuminated in turn by a long, narrow beam of illumination that moves in synchronism with the substrate. In this case, the scanning mirror is located between the light source and the DMD.

In both cases, the image scanning may be done by a small mirror mounted on a torsion bar that oscillates at a high frequency. Only a portion of the sinusoidal motion of the scanning mirror approximates the linear velocity of the scanning system, but the resultant exposure time is much longer than what could be tolerated if the motion compensation system were not in place.

In both cases, it is assumed that the magnification of the relay system imaging the DMD on the substrate is chosen so that the minimum feature size, typically given by $0.7\lambda/NA$ is half or less than the geometrical size of a DMD pixel image, i.e. the DMD pixel spacing divided by the relay lens magnification. This feature, combined with a multi-level gray scale, allows the edge of any feature equal to or greater than the DMD pixel image size to be placed appropriately. In the above equation $\lambda$ is the exposure wavelength and NA refers to the numerical aperture of the imaging system near the substrate plane. The gray scale is generated using M+1 exposure levels having relative doses of $1, 0.5, 0.25, \ldots \frac{1}{2}^M$. An M value of 4 yields a smallest exposure dose equal to $\frac{1}{16}$ of the largest single exposure, and therefore provides a means of adjusting the exposure dose at any line edge in $\frac{1}{16}$ increments up a largest accumulated dose of 31/16. Since the largest accumulated exposure dose corresponds to 1.9375 times the largest single dose, the worst-case adjustment error compared to the largest accumulated dose is about ±1.61%.

The advantage of scanning the DMD image is that the exposure time for a given frame rate is much longer, which reduces the maximum power required at the illumination source and improves the throughput. It also reduces the total number of frames required to create an acceptable image and therefore increases the time available to manipulate the data stream. Scanning the illumination image may require a frame rate in the range from 16,000-20,000 frames/second. Placing the scanner upstream from the relay optics can simplify packaging and reduce the footprint. An advantage of scanning the illumination is that the simple line and space illumination pattern that is scanned across the DMD is made up of only a few spatial frequency components that occupy only a few discrete positions in the illuminator pupil at which individual electro-optical phase shifters can be used to scan the illumination pattern in synchronism with the substrate. Electro-optical phase shifters can operate at megahertz rates and therefore can eliminate the delay between scans associated with resonant scanners.

A comparison between the DMD scanning and illumination scanning techniques is shown in Table 1 below:

TABLE 1

Technology Comparison

| Technology | Scanned DMD | Scanned Illumination | E-O Scanned Illumination |
|---|---|---|---|
| Scan velocity | 864 mm/s | 954 mm/s | 2777.1 mm/s |
| Mirror Cycles/pass | 3 | 20 | N/A |
| Diode power | 31.5 W | 126.1 W | 15.8 W |
| Resonant Mirror Freq. | 2,666.7 Hz | 20,000 Hz | N/A |
| Longest Exposure Time | 50 µs | 12.5 µs | 100 µs |
| Number of Columns | 71 | 71 | 71 |
| Gen 8 Exposure Time | 54.424 s | 49.92 s | 26.14 s |

The systems and methods disclosed herein substantially reduce or eliminate image smear that can result from optically coupling a fixed micro-mirror array to a substrate moving at constant velocity. This also greatly extends the exposure time during each frame, thus minimizing the laser diode power required.

There are many ways of adjusting geometry edge positions to a small fraction of the geometrical size of the DMD pixel image on the substrate. A method disclosed herein is directed to the use of a gray scale generated by combining a number of different, fixed, exposure levels. This method appears to be very efficient while maintaining proper alignment, i.e., maintaining the scan axis aligned with the direction of the DMD columns.

Thus, an aspect of the disclosure is a maskless digital lithography system for printing patterns in a photoresist layer on a moving substrate. The system includes: an illumination system configured to provide at a first object plane substantially uniform light of an exposure wavelength in exposure doses; a relay system arranged adjacent the illumination system and configured to relay the uniform light at the first object plane to a first image plane; at least one image transducer having an array of configurable pixels arranged at the first image plane and that form transducer patterns that receive and selectively modulate the exposure doses of the illumination light; an objective lens arranged to receive the modulated illumination from the at least one transducer and form in the resist layer images of the transducer patterns at a second image plane, thereby forming exposure patterns in the resist layer; a substrate stage that operably supports the substrate in the second image plane and that moves the substrate under the objective lens in a direction while maintaining the substrate substantially in the second image plane; a resonant scanning mirror located between the image transducer and the substrate, wherein the resonant scanning mirror is configured for angular movement that scans the transducer images in the direction of the substrate movement; and a controller operably connected to the at least one image transducer, the scanning mirror and the illuminator, wherein the controller synchronizes defining the transducer patterns of at least one image transducer with the illuminator exposure doses, the angular movement of the resonant scanning mirror and the movement of the substrate so that exposure patterns formed on the moving substrate have an amount of smearing that is one third of a pixel image or less.

Another aspect of the disclosure is the maskless digital lithography system as described above, wherein the spatial light modulator includes a digital mirror device.

Another aspect of the disclosure is a maskless digital lithography system for printing patterns in a photoresist layer on a substrate. The system includes: an illumination system having an optical axis and configured to provide substantially uniform bands of light at a first object plane; a relay optical system arranged adjacent the illumination system and having a relay pupil plane, the relay optical system configured to relay the uniform bands of light at the first object plane to a first image plane; a scanning device located at or near the relay pupil plane of the relay optical system and configured to cause the uniform bands of light to scan over a first image plane; at least one two-dimensional image transducer arranged at the first image plane and having an array of configurable pixels that form patterns, wherein the scanned bands of light illuminate one or more rows of the transducer patterns to form scanned patterned bands of light; an objective lens arranged to receive the scanned patterned bands of light and form therefrom a corresponding exposure pattern in the photoresist layer; and a controller operably connected to the at least one transducer, the scanning device and the illuminator, wherein the controller synchronizes the creation of the transducer patterns of at least one image transducer with the illumination thereof by the uniform bands of light, the scanning of the uniform bands of light by the scanning device and the movement of the substrate so that the exposure pattern has an amount of smearing that is one third of a pixel image or less.

Another aspect of the disclosure is the maskless digital lithography system described above, wherein the scanning device comprises an electro-optic scanner.

Another aspect of the disclosure is the maskless digital lithography system described above, wherein the illumination system includes an array of cylindrical lens elements, with each element forming one of the bands of light at the first object plane.

Another aspect of the disclosure is the maskless digital lithography system described above, wherein the spatial light modulator includes a digital mirror device.

Another aspect of the disclosure is a method of printing patterns in a photoresist layer on a moving substrate. The method includes: a) illuminating an image transducer with illumination light that defines one or more exposure doses to form patterned light using an array of configurable pixels of the image transducer that define a moving image-transducer pattern; b) reflecting the patterned light from a resonant scanning mirror to an objective lens to form an exposure pattern in the photoresist layer at a select position relative to an existing exposure pattern based on the one or more exposure doses; and c) scanning the resonant scanning mirror to scan the patterned light while synchronizing the moving of the image-transducer pattern with the moving of the substrate during the one or more exposure doses such that the exposure pattern has an amount of smearing that is one third of a pixel image or less.

Another aspect of the disclosure is the method described above, wherein the resonant scanning mirror has an oscillation angle that varies as a sinusoid over an angular range, and including limiting the angular range used for the one or more exposure doses to a substantially linear regime of the sinusoid so that the select position of the exposure pattern formed in the photoresist layer varies linearly with the oscillation angle and with time.

Another aspect of the disclosure is the method described above, wherein in act b) the select position has a positional error equal to an integral number of pixel images plus or minus one-fifth of a pixel image or less.

Another aspect of the disclosure is the method described above, wherein the exposure pattern has at least one edge, wherein the one or more exposure doses are performed to place the at least one edge of the exposure pattern at the select position.

Another aspect of the disclosure is the method described above, wherein the resonant scanning mirror has a scanning error curve that relates an error in the position of the exposure pattern to an angle of the scanning mirror, and wherein the one or more exposure doses are performed during at least one zero crossing in the scanning error curve.

Another aspect of the disclosure is the method described above, wherein the one or more exposure doses comprises multiple exposure doses having exposure dose levels wherein adjacent exposure dose levels differ by a factor of 2.

Another aspect of the disclosure is the method described above, wherein illuminating the image transducer includes relaying the illumination light from an illuminator to the image transducer using a relay optical system.

Another aspect of the disclosure is the method described above, wherein the image transducer includes a digital mirror device.

Another aspect of the disclosure is a maskless method of printing an exposure pattern in a photoresist layer on a moving substrate. The method includes: reflecting bands of illumination light from a scanning device to an image transducer to form scanned patterned bands of illumination light, wherein the scanning device undergoes angular movement; wherein the image transducer includes an array of configurable pixels that form transducer patterns, and wherein the scanned bands of illumination light illuminate two or more rows of transducer pixels to form patterned bands of light; and forming images of the scanned patterned bands of illumination onto the photoresist layer of the moving substrate using an objective lens to form an exposure pattern at a select position in the photoresist layer, including synchronizing: a) the angular movement of resonant scanning mirror, b) the substrate movement and c) the formation of transducer patterns, so that the exposure pattern has an amount of smearing that is one third of a pixel image or less.

Another aspect of the disclosure is the method described above, wherein the pixels of the image transducer are arranged in rows, and wherein the bands of illumination light illuminate rows that are evenly spaced apart.

Another aspect of the disclosure is the method described above, wherein the exposure pattern is formed by multiple exposures having different dose levels that are used to generate an accumulated exposure dose that varies with position on the substrate.

Another aspect of the disclosure is the method described above, wherein the bands of illumination light are defined by an array of cylindrical lens elements.

Another aspect of the disclosure is the method described above, wherein the image transducer includes a digital mirror device.

Another aspect of the disclosure is the method described above, wherein the scanning device comprises a resonant scanning mirror arranged substantially at a pupil plane of a 1:1 doubly telecentric optical relay system.

Another aspect of the disclosure is the method described above, wherein the array of configurable pixels in the image transducer includes columns of pixels, and wherein the multiple exposures having different dose levels are generated by using a combination of different activated pixels in a column scanned by the same band of light and by different dose levels delivered by the illumination system.

BRIEF DESCRIPTION OF THE DRAWINGS

FIG. 3B is a close-up view of the cylindrical optical system showing the stack of cylindrical lens elements, the individual light beams formed by the cylindrical optical system. and the tilted focus plane formed by the focused individual beams.

FIGS. 4A through 4C illustrate an example of an illumination pattern (FIG. 4A), a DMD pattern (FIG. 4B), and the resulting substrate image (FIG. 4C), noting that in FIG. 4B every $4^{th}$ column is totally "off" in order to separate one scanned pattern from another.

DETAILED DESCRIPTION

In the discussion below, an example application considered is flat-panel lithography such as used to form flat-panel displays. The minimum feature size is 2.0 microns at the substrate using an exposure wavelength of λ=0.403 μm. It is assumed, by way of example, that the imagery is produced by scanning the flat-panel substrate under the DMD image and that the long dimension of the DMD is oriented perpendicular to the scan direction.

The systems and methods described herein are applicable to a very wide range of minimum feature sizes, and the choice of a 2 micron minimum is merely by way of example and for ease of discussion.

The terms "image transducer" and "spatial light modulator" are used interchangeably, and the term "DMD" is used as an example of an image transducer or spatial light modulator in the discussion below by way of non-limiting example. The term "scanning mirror" means a "resonant scanning mirror" unless otherwise noted.

Example Maskless Digital Lithography Systems

As noted above, there are two main embodiments of the maskless digital lithography systems disclosed herein: a first embodiment where the DMD is upstream of the scanning mirror and a second embodiment where the DMD is downstream of the scanning mirror. These two embodiments are now described below.

First System Embodiment

Figure 1A:
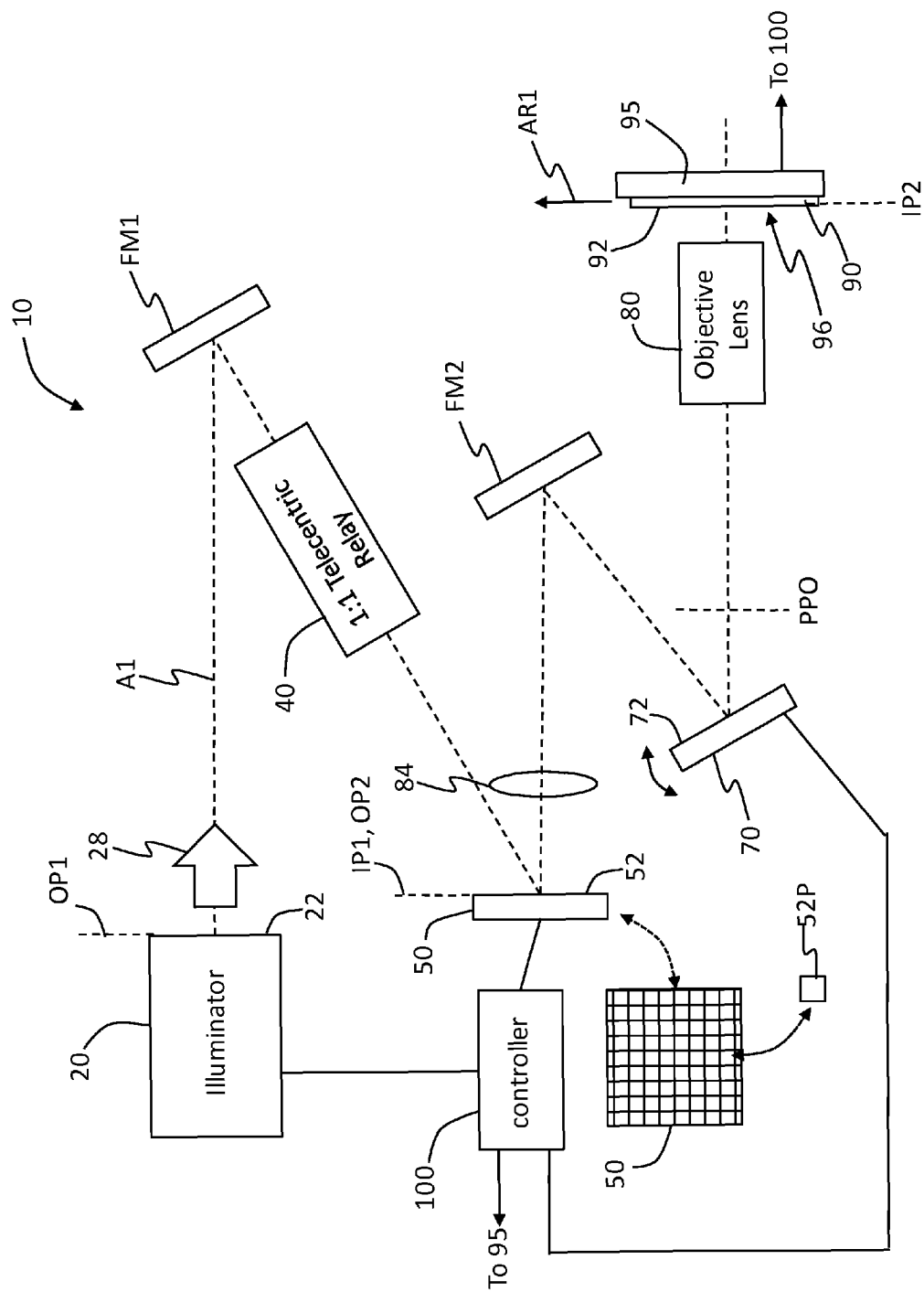
FIG. 1A is a schematic diagram of a first example of maskless digital lithography system according to the disclosure, wherein the DMD is upstream of the scanning mirror.

FIG. 1A is a schematic diagram of the first embodiment of a maskless digital lithography system ("system") 10 according to the disclosure. The system 10 includes an illuminator 20 having an output end 22 that emits light 28 along an axis A1. System 10 also includes in order along axis A1: a first fold mirror FM1, a telecentric relay 40, a DMD 50 with a surface 52 defined by micro-mirror pixels ("pixels") 52P (see close-up inset), a field lens 84, a second fold mirror FM2, a scanning mirror 70 with a surface 72, an objective lens 80, and a substrate 90 having a surface 92. A controller 100 is operably connected to illuminator 20 and DMD 50 and is configured to control the operation of system 10. In an example, controller 100 is programmable and causes a change in at least one of the DMD 50 and illuminator 20 based on instructions stored on a non-transient computer-readable medium. In an example, controller 100 acts a sequencer in that it sends pattern information ("a pattern") to DMD 50 that corresponds to a specific available dose level and specific positions on substrate 90, and signals the illuminator 20 as what available dose levels to employ and when to start and finish the exposure.

The fold mirrors FM1 and FM2 are optional but are useful for making system 10 compact and for keeping various sections of axis A1 running in the same direction. The telecentric relay is a 1:1 relay in an example.

The substrate 90 is operably supported by a substrate stage 96 that can move so that the substrate 90 can be scanned, as discussed below. In an example, substrate surface 92 includes at least one photosensitive layer 96, such as photoresist ("resist"). In the discussion below, forming an image on the substrate surface can include forming an image in the photosensitive layer 96 formed thereon to define an "exposure pattern" or a "photoresist pattern."

In an example, controller 100 is operably connected to substrate stage 96 and scanning mirror 70 and controls the movement of the substrate stage and scanning mirror, or receives information about the movement of the substrate stage and scanning mirror in connection with operating illuminator 20, DMD 50 and scanning mirror in a synchronous or coordinated manner with respect to the movement of substrate 90.

The output end 22 of illuminator 20 resides at a first object plane OP1 of the telecentric relay 40, while the surface 52 of DMD 50 lies at a first image plane IP1 of the telecentric relay. The objective lens 80 and field lens 84 define a second object plane OP2 at the surface 52 of DMD 50. The objective lens 80 and field lens 84 also define a second image plane IP2 at which the surface 92 of substrate 90 resides.

Figure 1B:
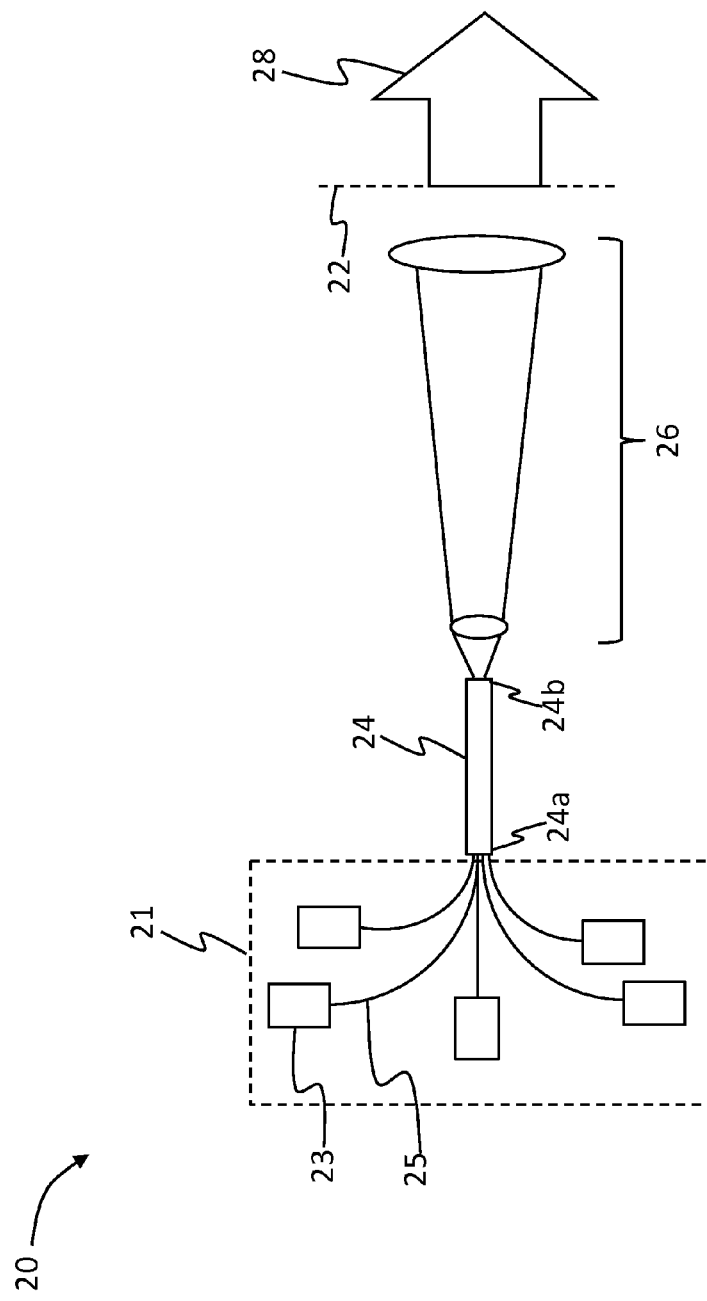
FIG. 1B is a schematic diagram of an example configuration for the illuminator of the system of FIG. 1A.

FIG. 1B is an example embodiment of illuminator 20 for use in system 10 of FIG. 1B. Because the scanning mirror 70 is downstream of DMD 50, the illuminator 20 can be configured to deliver a conventional substantially uniform illumination beam that covers the active portion of the surface 52 of DMD 50. In an example, illuminator 20 of FIG. 1B includes a plurality of laser diodes 23 optically connected to a uniformizer 24 (e.g., a light pipe or light tunnel) via respective optical fiber sections 25. The uniformizer 24 has an input end 24a and an output end 24b. In an example, the uniformizer has an NA of about 0.12. An optical system 26 is operably disposed adjacent output end 24b of uniformizer 24.

The optical fiber sections 25 convey light from the laser diodes 23 into input end 24a of uniformizer 24, which outputs substantially uniformized light at output end 24b. The optical system 26 receives the light outputted at output end 24b of uniformizer 24 and expands the light to form an image large enough to cover the active portion of the DMD with a uniform output beam of light 28.

Second System Embodiment

Figure 2A:
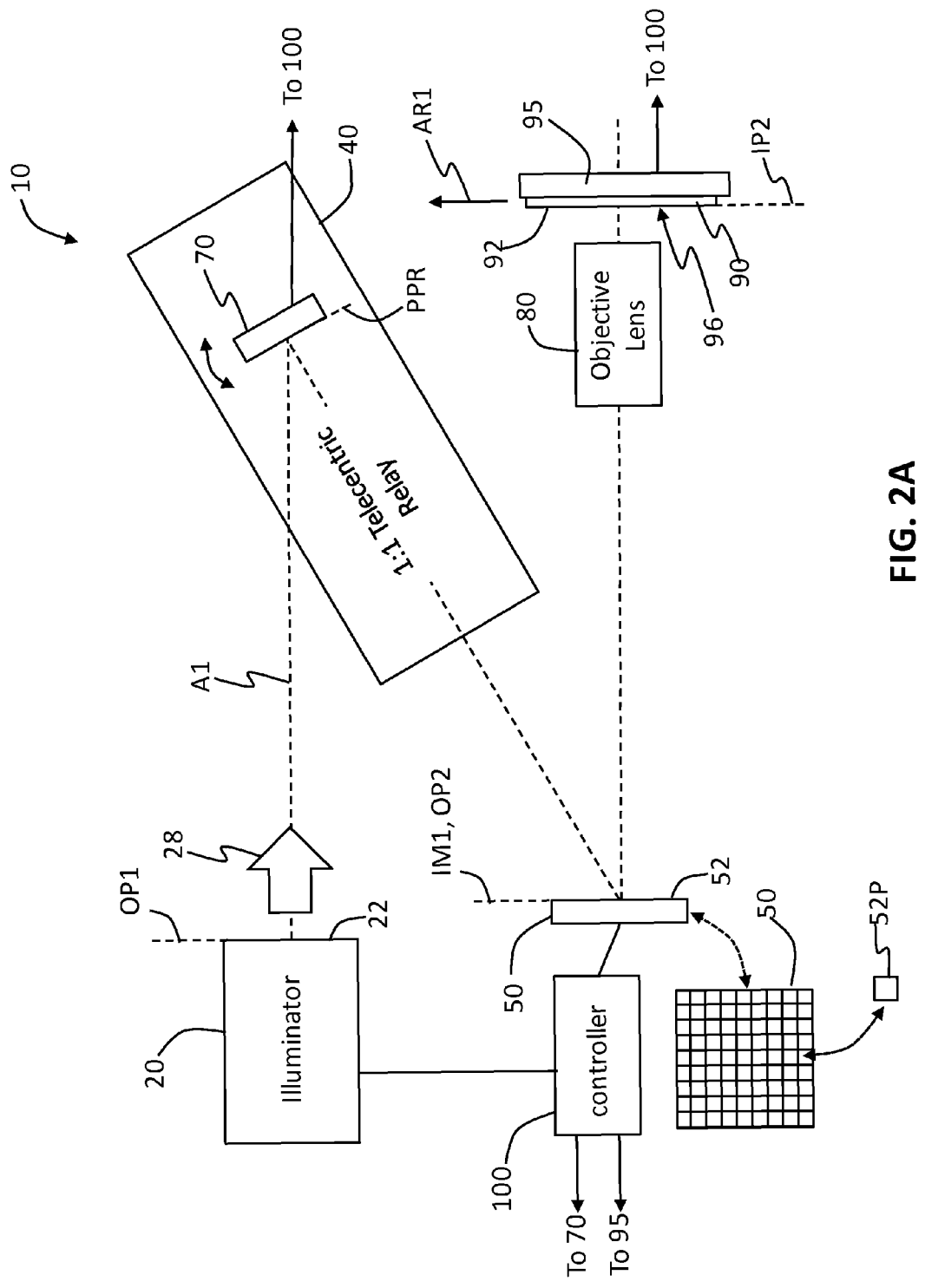
FIG. 2A is a schematic diagram of a second example of maskless digital lithography system according to the disclosure, wherein the scanning mirror is upstream of the DMD.

FIG. 2A is a schematic diagram of the second embodiment of system 10 wherein the scanning mirror 70 is upstream of the DMD 50 (i.e., scanning mirror 70 is located between illuminator 20 than the DMD). The system 10 of FIG. 2A includes in order along axis A1: Illuminator 20, telecentric relay 40 having the scanning mirror 70 incorporated therein, DMD 50, objective lens 80 and substrate 90 supported by substrate stage 95. System 10 of FIG. 2A also includes controller 100 generally arranged as in system 10 of FIG. 1A but internally configured (e.g., via programming, etc.) to operate to accommodate the different way system 10 of FIG. 2A operates as compared to system 10 of FIG. 1A, as discussed below.

Figure 2B:
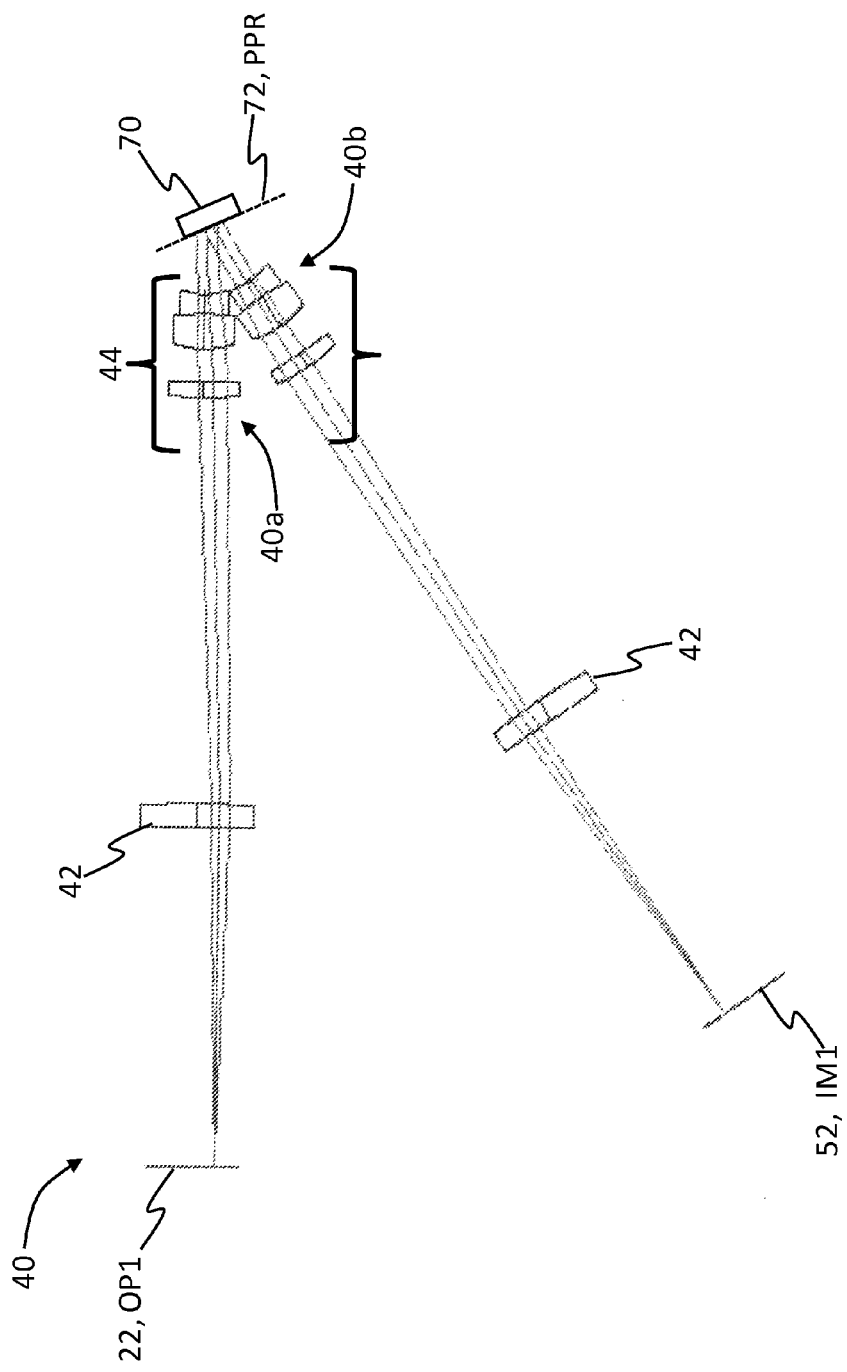
FIG. 2B is a schematic diagram of an example configuration for the illuminator relay of the system of FIG. 2A.

FIG. 2B is a schematic diagram of the example telecentric relay 40 of system 10 of FIG. 2A. The telecentric relay includes relay optics 44 that has two sets of lenses 44a and 44b between which is located scanning mirror 70 at a relay pupil plane PPR. The telecentric relay also includes field lenses 42 operably disposed on respective sides of relay optics 44. The field lenses 42 assist in establishing the telecentricity of telecentric relay 40.

Figure 2C:
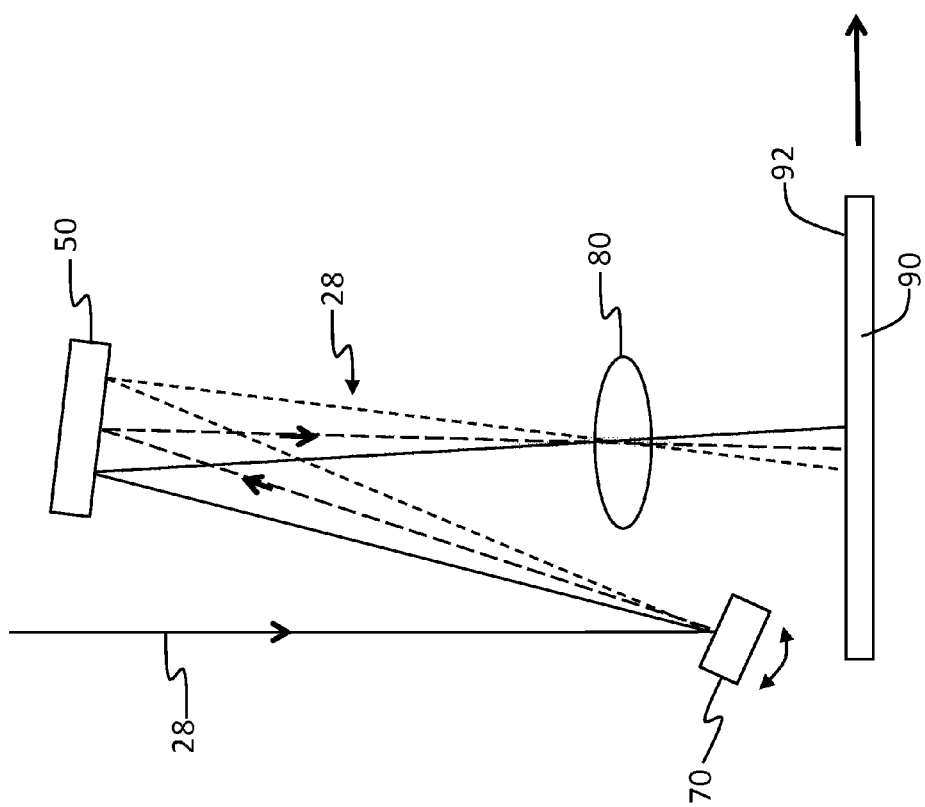
FIG. 2C is a schematic diagram, showing how a light beam is deflected by the scanning mirror so that it moves in synchronism with a moving substrate, thereby forming an image that moves along with the moving substrate.
Figure 2D:
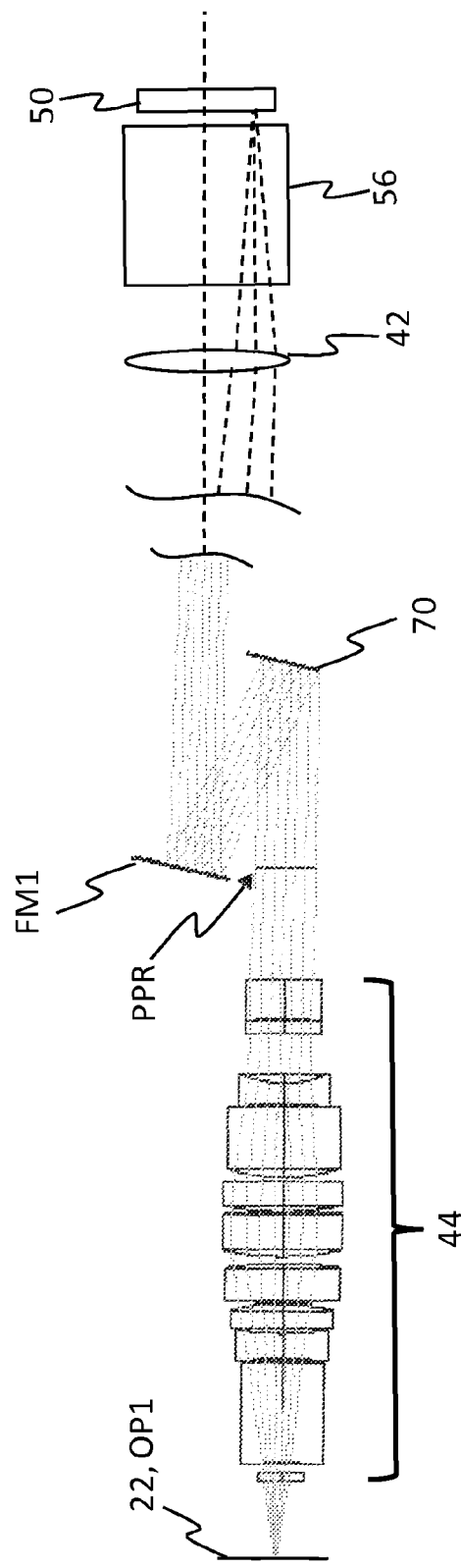
FIG. 2D is a schematic optical layout a portion of the system of FIG. 2A showing an example configuration of the telecentric relay system wherein the scanning mirror is arranged near the relay pupil plane, and showing a prism assembly immediately adjacent the DMD.

FIG. 2C is a close-up schematic optical diagram of a hypothetical imaging system illustrating how a scanning mirror 70 deflects light beam 28 (solid, dashed and dotted lines) so the beam scans over the substrate plane such that the image formed on the substrate 92 follows the movement of the substrate. FIG. 2D is a more detailed optical diagram that shows an example of how the scanning mirror 70 is arranged in proximity to the relay pupil plane PPR. FIG. 2D also shows a prism assembly 56 used immediately adjacent DMD 50 to efficiently illuminate the DMD at the correct incidence angle (24°) and to direct the normally reflected illumination from the DMD parallel to the relay axis. An example of such a prism is known in the art and is described for example in U.S. Pat. No. 8,642,232 (see, e.g., FIG. 2A therein).

Figure 3A:
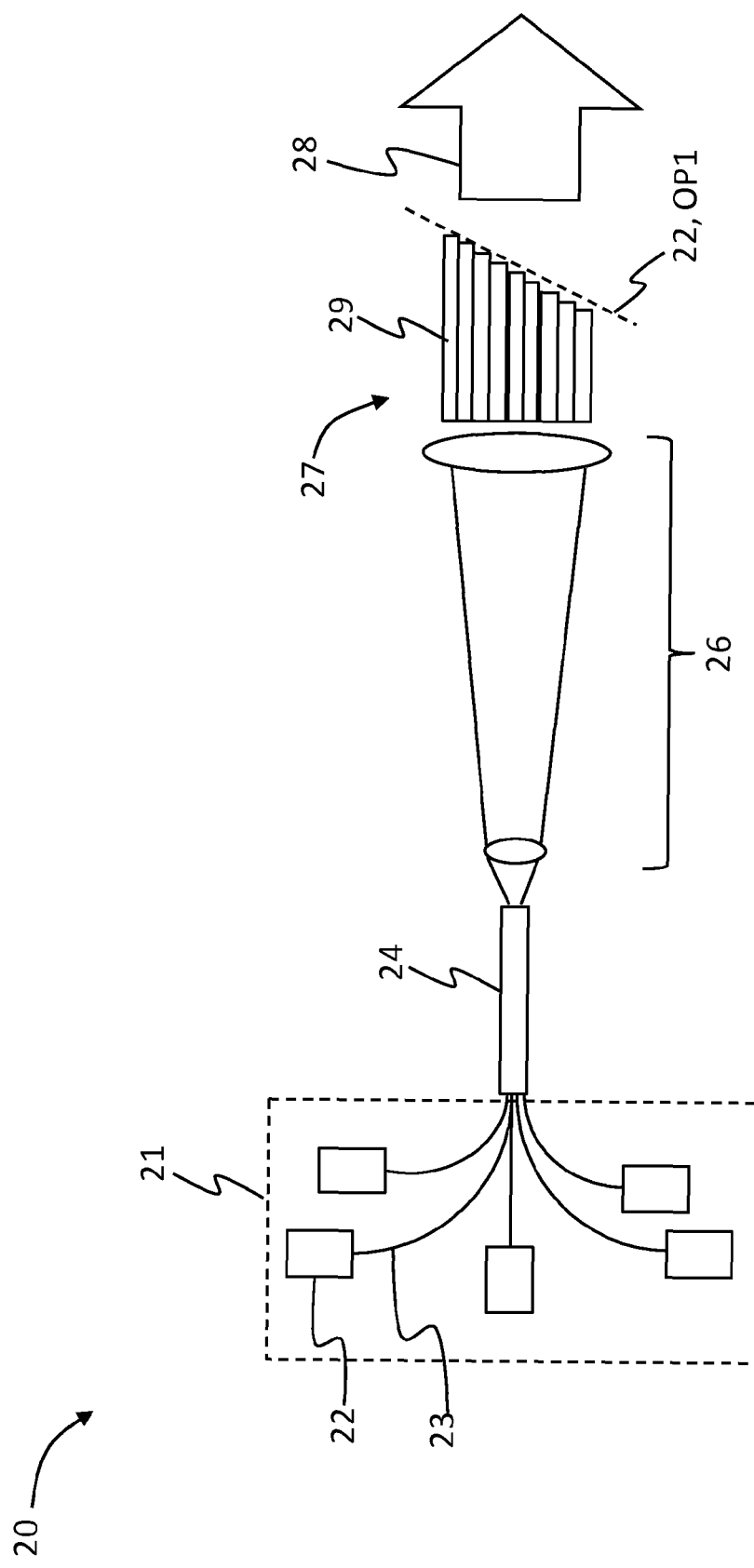
FIG. 3A is a schematic diagram of an example configuration for a portion of the illuminator of the system of FIG. 2A.

FIG. 3A is a schematic optical diagram of an example illuminator 20 for system 10 of FIG. 2A. Illuminator 20 of FIG. 3A is similar to that shown in FIG. 1B and that further includes a cylindrical optical system 27 arranged at the output end of optical system 26. Cylindrical optical system 27 includes a stack of cylindrical lens elements 29. FIG. 3B is a close-up view of the cylindrical lens stack of FIG. 3B.

The bands of light generated by the cylindrical lens stack shown in FIG. 3B serve as the input to the telecentric relay 40 shown in FIG. 2B. The scanning mirror 70 in the pupil location of the telecentric relay scans the bands of light across the rows of mirrors in the DMD. It is desirable to illuminate specific rows of DMD pixels, e.g., every 4th row of DMD pixels. Thus, cylindrical optical system 27 is configured as a stack of cylindrical lens elements 29 where each cylindrical lens element is 4 pixels (e.g., 43.2 microns) thick and is arranged to generate a line image 10.8 microns wide, which corresponds to an NA of about 0.02612 and a focal length of 827 microns.

Since every 4th pixel is illuminated and the DMD contains 1080 pixels in the scan direction, a minimum of 270 cylindrical lens elements 29 is required in the cylindrical lens stack for the example DMD under consideration. The tilted object plane OP1 is generated by varying the axial thickness of each cylindrical lens element 29. Note that the output beam 28 is divided up into a number of individual beams 28' that come to a focus and at a tilted focal plane FP that defines the aforementioned object plane OP1 for telecentric relay 40.

The tilted focal plane FP produced by the cylindrical optical system 27 is imaged onto the DMD surface 50 using telecentric relay 40. In an example, telecentric relay 40 covers a 24 mm diameter or larger field and operates at an NA of 0.02612. As shown in FIG. 2D, the scanning mirror 70 can be located at or near the relay pupil plane PPR, which is where the beam size is smallest. One of the reasons for employing a 1:1 relay is that this magnification faithfully reproduces a given tilt in the first object plane OP1 at the first image plane IP1, thus ensuring that the fine line image produced by each cylindrical lens element 29 in the cylindrical lens stack is sharply imaged on the corresponding pixel row of the DMD 50. The line images formed by the cylindrical lens elements are also referred to herein as bands of light.

The periodic structure of the pattern serving as the input to the telecentric relay of FIG. 2B produces an interference pattern in the pupil plane consisting of a series of strips wherein each strip corresponds to a different spatial frequency or Fourier component of the input image. Because the input pattern is one dimensional, the pupil pattern is also one dimensional. This configuration is discussed below in connection with FIG. 19, wherein the different orders at relay pupil plane PPR are parallel lines.

FIGS. 4A through 4C illustrate how the illumination pattern from the illuminator 20 of FIG. 3A is used to illuminate DMD 50 to create a resultant pattern on substrate surface 92. FIG. 4A illustrates an example illumination pattern wherein bands of light BL correspond to every $4^{th}$ row of pixels in the DMD. FIG. 4B illustrates an example DMD pattern defined by DMD pixels 52P. FIG. 4C shows the resultant pattern formed on the substrate surface 92 by illuminating the DMD pattern of FIG. 4B with the the bands of illumination BL of FIG. 4A.

Placement of the Scanning Mirror

A preferred location for scanning mirror 70 is where the light bundle reflected by each pixel 152P is superimposed. This happens to be the relay pupil location PPR. Since it may not be convenient to place the scanning mirror 70 precisely in this location, it is usually possible to get it close, such as shown in FIG. 2D.

In the design example shown in FIG. 2D, the effective length between scanning mirror 70 and the field lens in front of the DMD is about 220.4 mm. To move from one pixel 152P to another on the DMD requires an angular tilt of the scanning mirror of $(0.0108 \text{ mm})/((2)(220.4 \text{ mm})) = 2.45 \times 10^{-5}$ radians, which is relatively small. In all cases the entire pattern on the DMD is imaged onto to substrate surface 92, but in cases 1 and 2 discussed below the exposure lasts only while the substrate travels ⅙ of an oscillation cycle or over a travel distance of 1080/6=180 pixels or about 0.253°, assuming pattern can be completed in a single scan. In this case the maximum excursion of scanning mirror 70 is twice the useful scan angle or 0.5°.

Magnification and Numerical Aperture (NA)

Choosing the optimum combination of magnification M and NA for a direct-write application is not the same as choosing the magnification M and NA for a conventional-mask imaging application. In a conventional imaging application, it is usually assumed that the mask details can be made to have any size required so that the magnified version of these features on the wafer corresponds to the correct size. In the conventional case, the magnification turns out to depend on other variables, such as the mask blank size or the resolution of the tool used to write the mask.

It is important that system 10 have an NA sufficient to resolve the desired features. In an imaging application, using modern photoresists, the required minimum NA is approximated by the formula;

Min. Feature=$0.7\lambda/NA$=$0.7(0.403)/NA$=$2.0$ μm $$NA=0.7(0.403)/2=0.141 \qquad (1)$$

A minimum feature size of 2 microns implies that 2.1 micron features can be achieved as well. A repeating pattern of 2.1 micron lines and spaces is difficult to accomplish if the magnified pixel DMD pixel size is also 2 microns. However, if the minimum feature size is set to the size of half a de-magnified DMD pixel 152P, as required by the Nyquist criterion, then with sufficient control of the gray scale it is possible to duplicate any geometry larger than 2 microns.

Thus, the magnification M from the substrate 90 to the DMD 50 has to be at least equal to two times the DMD pixel size divided by the minimum feature size, i.e., (2×10/2=10), but a better ratio would be a slightly higher magnification such as 11 or 12. A higher magnification ratio improves the resolution and decreases the field size and therefore the throughput. A magnification of 12 will be used hereinafter.

Equation (1) above is based mainly on experience with diffraction-limited optical imaging, where a conventional mask is imaged onto a wafer using partially coherent light, i.e., illumination that under-fills the aperture of the projection system by a factor of about 0.5 in diameter. This ratio is often called "fill factor" or a and produces a significant improvement in the slope of the intensity distribution near an edge so that better line width control is achieved.

Figure 5:
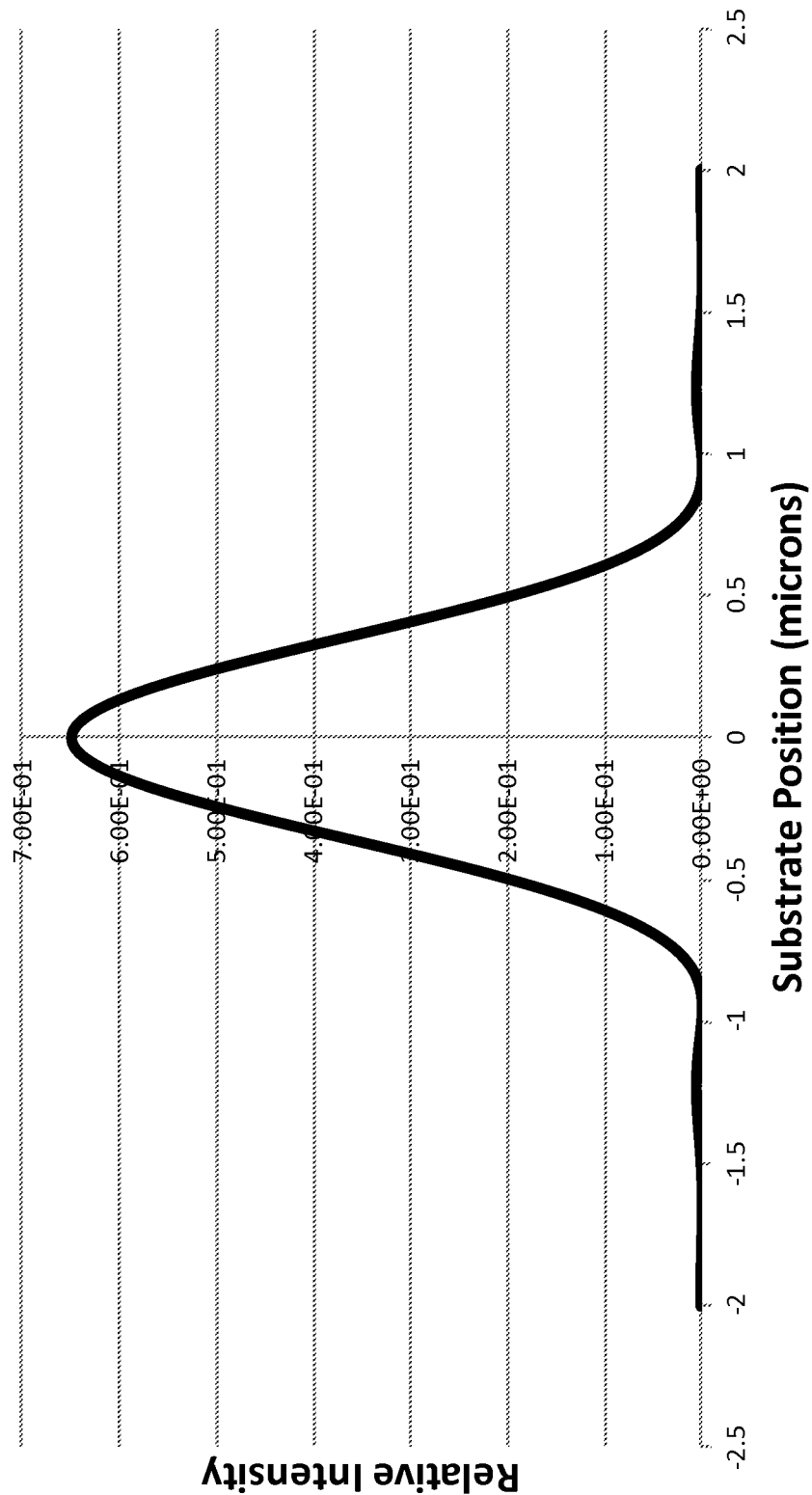
FIG. 5 is a plot of relative intensity versus substrate position generated by simulation of imaging with a projection system using a 10 micron pixel imaged by a 0.08333 magnification, 0.282 NA system having an illumination fill factor of 0.25 and operating at a wavelength of 403 nm, and wherein the finite pixel size (10 µm in the object plane) broadens slightly the image profile.

Disadvantages of using partially coherent illumination include a reduction in the amount of light that can be obtained from conventional incandescent sources and a more pronounced ringing after the first minimum in the line edge intensity profile. The finite size of the minimum feature on the mask also has some effect on the resulting intensity profile. This can be discerned by using a program that takes into account both the angular distribution of energy incident on the pixel, the size of the pixel, and the numerical aperture of the projection lens. This is shown in the plot of FIG. 5 of the relative intensity versus the substrate lateral position, wherein the intensity profile was generated by simulation of imaging with a projection system using a 10 micron pixel imaged by a 0.08333 magnification, 0.282 NA system having an illumination fill factor of 0.25 and operating at a wavelength of 403 nm. The effect of the finite pixel size (10 μm in the object plane) is to broaden slightly the image profile.

Diffraction Efficiency

In generating the intensity profile of FIG. 5, the NA of the projection system was doubled beyond the minimum necessary in order to catch more of the light diffracted from the illuminated pixel.

A potential issue with using DMD 50 as a mask is there is usually a fairly big)(~1° tolerance of the tilt angle of the micro-mirror pixels 152P. This error results in the diffracted orders being moved away from their normal location in the pupil plane of the objective lens 80. It is generally considered good practice to employ small sigma values and oversize the numerical apertures of the system to ensure that nearly all the diffracted light is transmitted through the pupil plane.

It is estimated that about 63% of the light diffracted from a 10-μm square pixel will make it through 0.282 NA aperture with a 0.25 illumination fill factor.

The Velocity Design Constraint

One of the constraints on any scanning system is the maximum scanning speed of the substrate, which is usually defined by the limitations of the substrate stage 95 that supports the substrate. If it were only necessary to project a pattern once from the DMD without having to repeat it, and the DMD was operated at 20,000 frames/s, then the substrate velocity v would be given by:

$v$=(1080 pixels)(10.8 μm/pixel)(20,000 frames/s)/
12=19.44×$10^6$ μm/s

This velocity is faster than necessary. A scan velocity of about 486 mm/s would be acceptable and would allow 40 exposures of the same portion of the pattern before it passes beyond the DMD. This corresponds to a substrate motion of 1080/40=27 pixels between each exposure.

A Scanned DMD Image

Placing scanning mirror 70 between the DMD 50 and the substrate 90 (such as in the first embodiment of system 10 of FIG. 1A) to scan the DMD image in synchronization with the scanning substrate has the advantages of allowing a much longer scan excursion between exposures and allowing a much lower frame rate and resonant frequency on the scanning mirror. In order to generate a gray scale, each portion of the DMD pattern would have to be imaged and scanned onto the substrate multiple times, depending on the number of different intensities used to compose the gray scale. A substantial advantage of this alternative is that it eliminates any need for duplicate rows and blank lines because an entire frame can be composed on the DMD 50 and scanned onto substrate surface 92 (or more specifically, the photoresist layer 96 formed thereon, as noted above). Then the next frame can be composed and scanned, etc.

In each case, the entire array of 1080 by 1920 pixels 52P is imaged onto substrate surface 92 without any image blur except for a small discrepancy arising from the sinusoidal motion of scanning mirror 70 and the constant velocity of the substrate 90. This requires a slightly larger field to accommodate the size of the DMD plus a little extra width for the scan angle. If five different intensity levels are required to compose the gray scale then a minimum of five exposures are required during the time it takes the substrate 90 to move a distance corresponding to the width of the DMD image on the substrate. Since the substrate 90 moves appreciably between one image and another, this motion has to be taken into account when composing the DMD image.

Example Imaging Cases

Example imaging cases are now described by way of example in which example values for the resonant frequency of the scanning mirror, the DMD frame rate and the scan velocity of the substrate are considered.

Case 1

Figure 6:
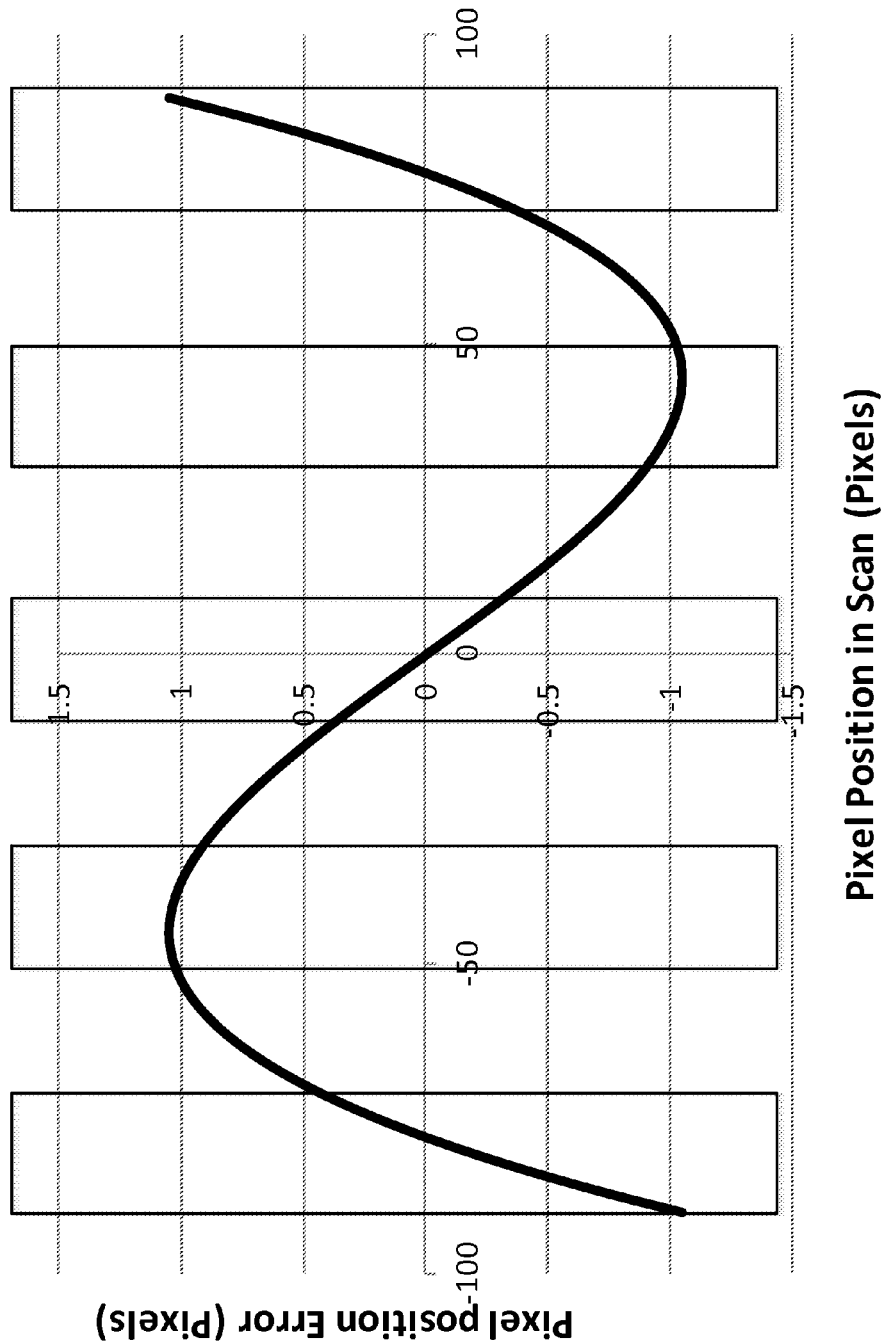
FIG. 6 is a plot of the pixel position error (pixels) versus the pixel position along the scan path (pixels), illustrating how 5 equally spaced exposures results in either large pixel position errors or unacceptably large image smearing.

The plot of FIG. 6 of the pixel position error versus pixel position in the scan illustrates the possibility of dividing a single scan by the resonant mirror into 5 equally long exposures separated by a comparable reset time. The maximum frame rate of a typical DMD 50 is 20,000 frames/second or 50 μs per frame, with about 25 is of the 50 μs being available for exposure. If five frames are required to compose an image and each frame takes 50 μs, then the minimum time to scan the length of the DMD image is 5×50=250 μs. This estimate assumes that the scanning and data management systems can keep up, which may not be true. The time span between the start of the first exposure and finish of the last exposure is 225 μs.

If it is also assumed that in the time it takes the substrate 90 to move the distance corresponding to the width of the DMD image, that the resonant mirror makes a complete oscillation and that only during ⅙ or less of that oscillation is the image and the substrate in reasonable synchronization, then the time taken to scan the width of the DMD image is 6×225 μs=1.35 ms. This time corresponds to a maximum velocity of:

Max. substrate velocity=1080(0.01080 mm)/((12) (0.00135 s))=720 mm/s

In this particular case, the maximum exposure time is 25 μs and the shortest exposure time is 25 μs/16=1.562 μs.

Also in this case, the resonant frequency of scanning mirror 70 is determined by the time to scan the width of the DMD image, which is 1/0.00135 s=740.74 Hz. This frequency is very comfortably within that of available commercial scanners having an 10 mm diameter mirror.

The laser power required to produce a 30 mJ/cm² exposure on the substrate is given by:

$$\text{Power at substrate} = (\text{Dose})(\text{Image area})/\text{Total Exposure Time}$$
$$= (.03 \text{ Ws/cm}^2)(.0168 \text{ cm}^2)/((31/16)(25\times 10^{-6}\text{s}))$$
$$= 10.4 \text{ W}$$

The 31/16 factor comes from adding together 5 exposure levels corresponding to 1+½+¼+⅛+1/16. Assuming a diffraction efficiency of 63% and a transmission efficiency of 55% for the illumination and projection systems, then the laser power required at the diode source is 10.4/0.346=30 W. FIG. 6 shows that this proposed scheme produces unacceptably large image offsets as high as ±1 pixel (distortions) and pronounced image smearing as high a 1.4 pixels.

Case 1

Figure 9:
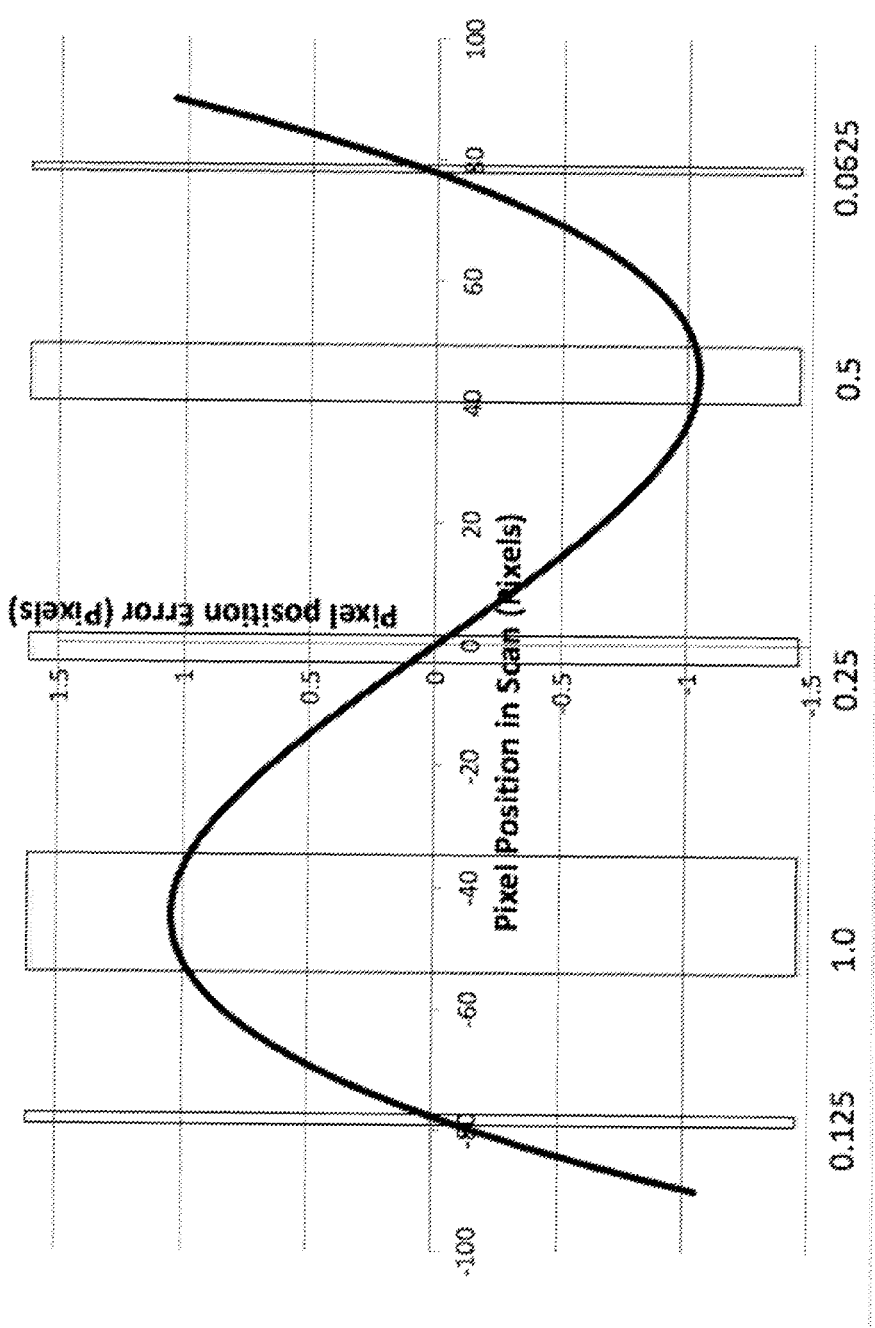
FIG. 9 is similar to FIG. 6 and shows how varying the exposure time, rather than the intensity, can be used to reduce pixel smear.

Both the DMD 50 and the light source 20 can operate asynchronously opening up the possibility of varying the exposure time to change the dose, rather than reducing the intensity. FIG. 9 illustrates how various exposure times can be employed to reduce image smearing and limit image offsets to an amount about equal to an integer number of pixels. The two longest exposures in FIG. 9 are arranged so that they coincide with the peak and valley of the distortion curve. The average resultant distortions correspond to either +1 or −1 pixel and this can be compensated for by shifting the data in the DMD up or down one row. The other 3 exposures are located at the zero crossings of the scanning error curve where the average offset is zero and the image smear is minimized by the short time duration of the shortest 3 exposures. Thus the scheme illustrated in FIG. 9 appears to be plausible and yields a maximum exposure time of 25 μs.

Case 2

Figure 10:
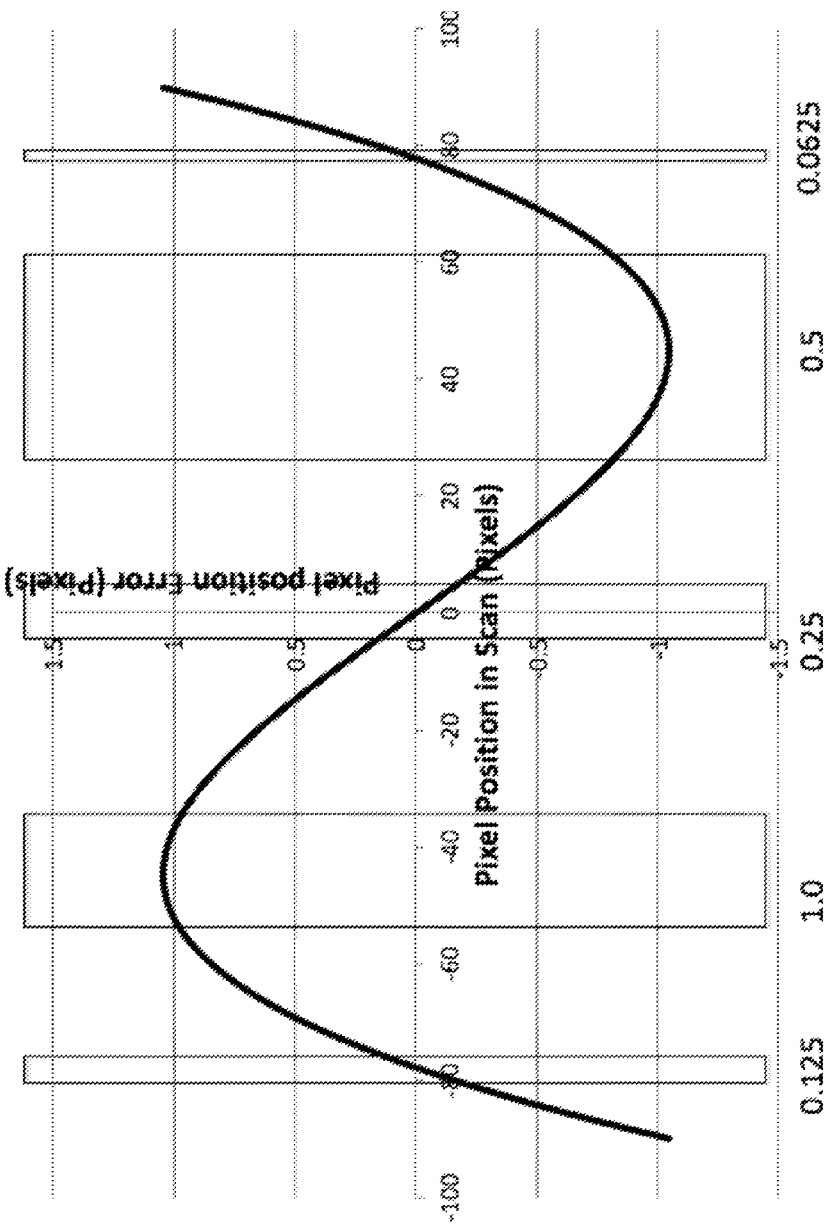
FIG. 10 is similar to FIG. 9 and shows an example of longer variable exposure times.

The plot of FIG. 9 is similar to that of FIG. 10 except that the exposure times are doubled. This requires extending the total available scan time from 225 μs to 275 μs, but it cuts the laser peak power required in half with only a small loss in throughput.

Case 3

Figure 11:
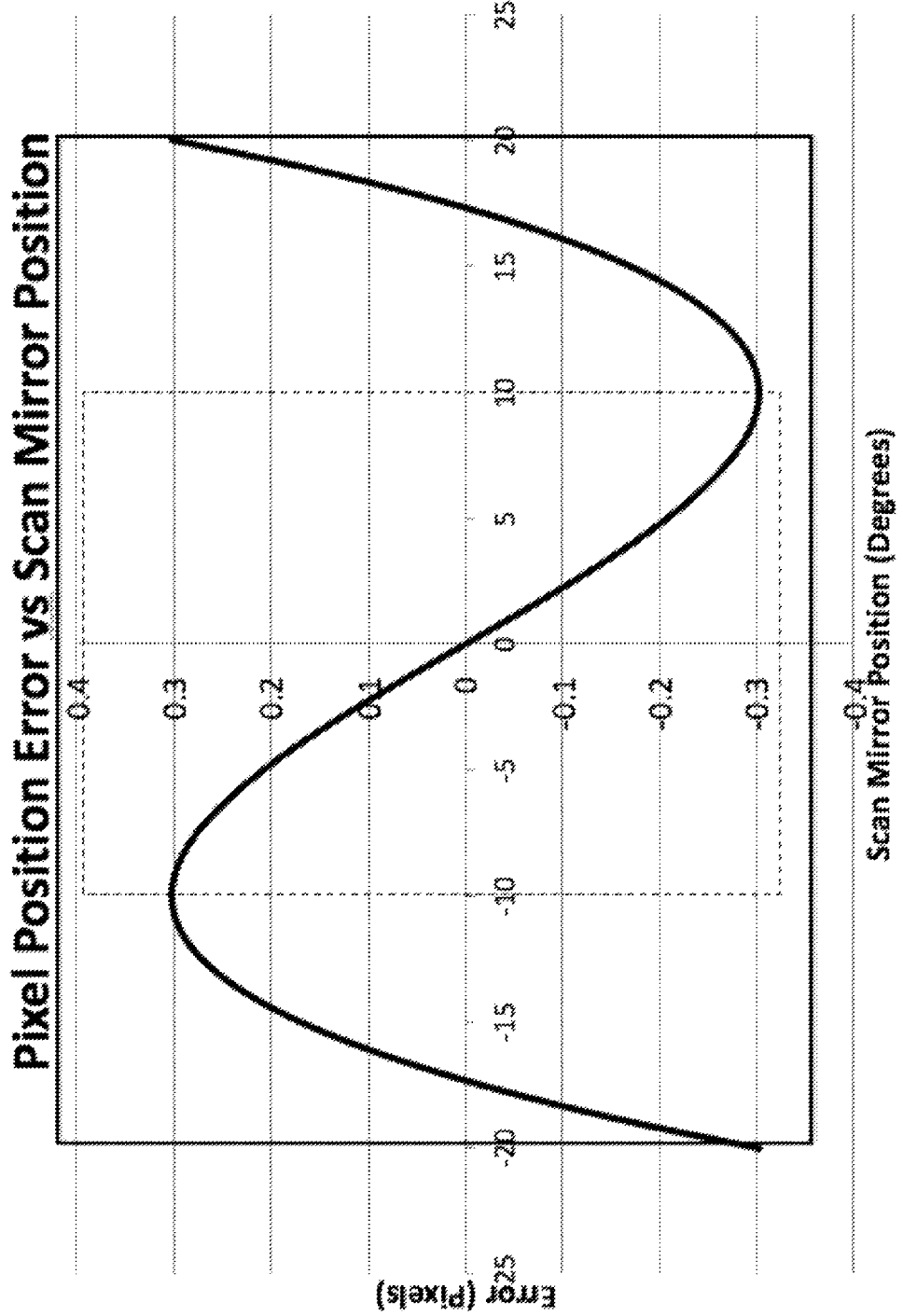
FIGS. 11 and 12 are plots of the error (pixels) versus scan mirror position (degrees), illustrating an example of reducing the laser power required by spreading 5 exposures over several scan mirror oscillation cycles, such as having the largest and second largest exposures performed in the first and second cycles and the remaining 3 exposures in the last cycle.
Figure 12:
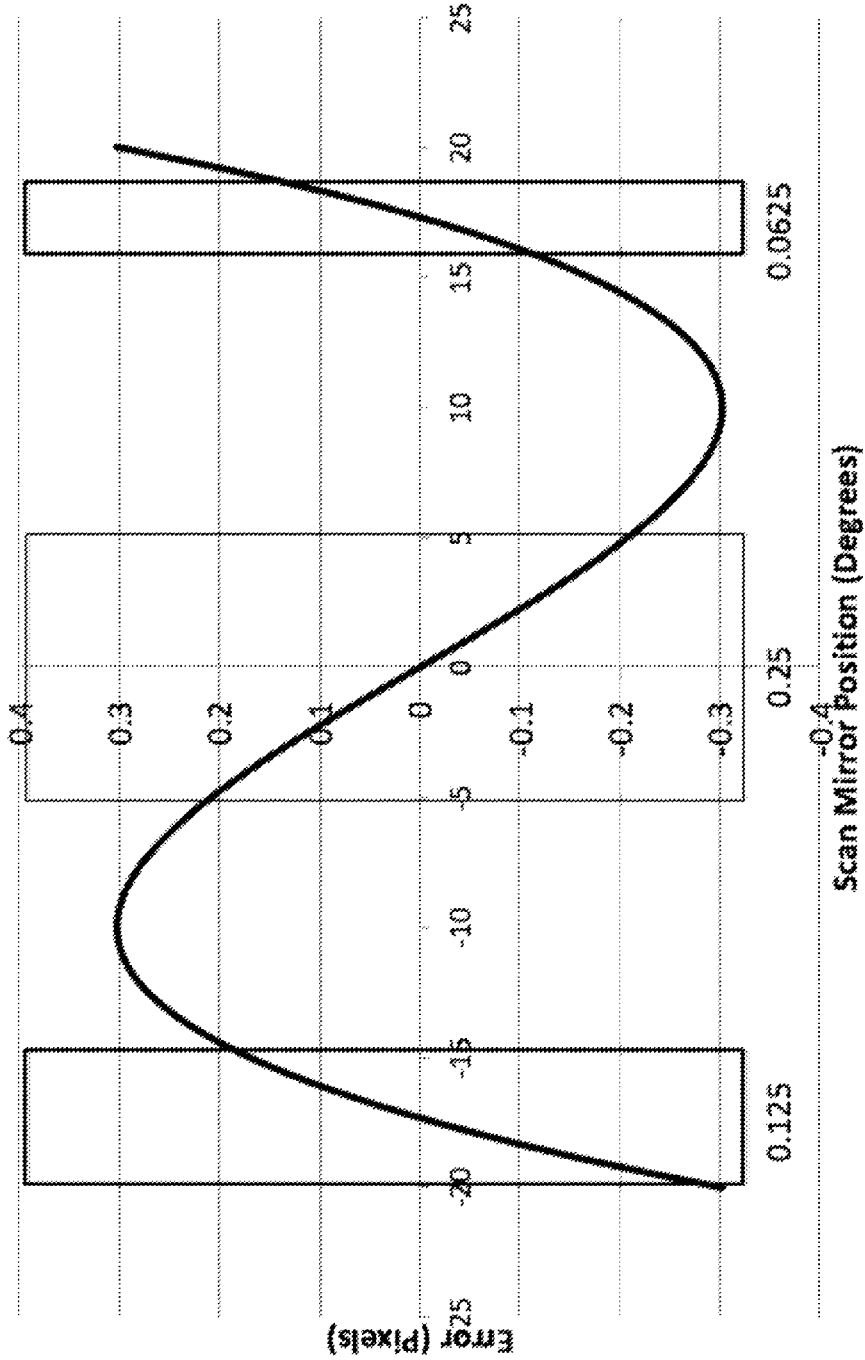

Another possibility, as illustrated in the plots of FIGS. 11 and 12, is to have the resonant mirror make three oscillations in the time required to scan one DMD image width. In this case, the longest exposure is made in 100 μs during one oscillation and the second longest exposure is also made in a single oscillation. These two exposures are illustrated in FIG. 11. The remaining three exposures are done during the third oscillation as illustrated in FIG. 12 In this case in order to minimize the amount of image smear the useful scan amplitude is reduced from ±30° to ±20°. Assuming the longest exposure takes 100 μs, the laser power required is halved again to 15 W at the DMD. The time for single oscillation is:

Oscillation Time=(100 μs)(360/40)=900 μs

Resonant Frequency=1/900 μs=1,111 Hz

Scan velocity=1080*0.0108 mm/(12*3*900 μs)=360 mm/s

This appears to be feasible with a 10 mm diameter, resonant scan mirror

Scan Angle Errors

Figure 7:
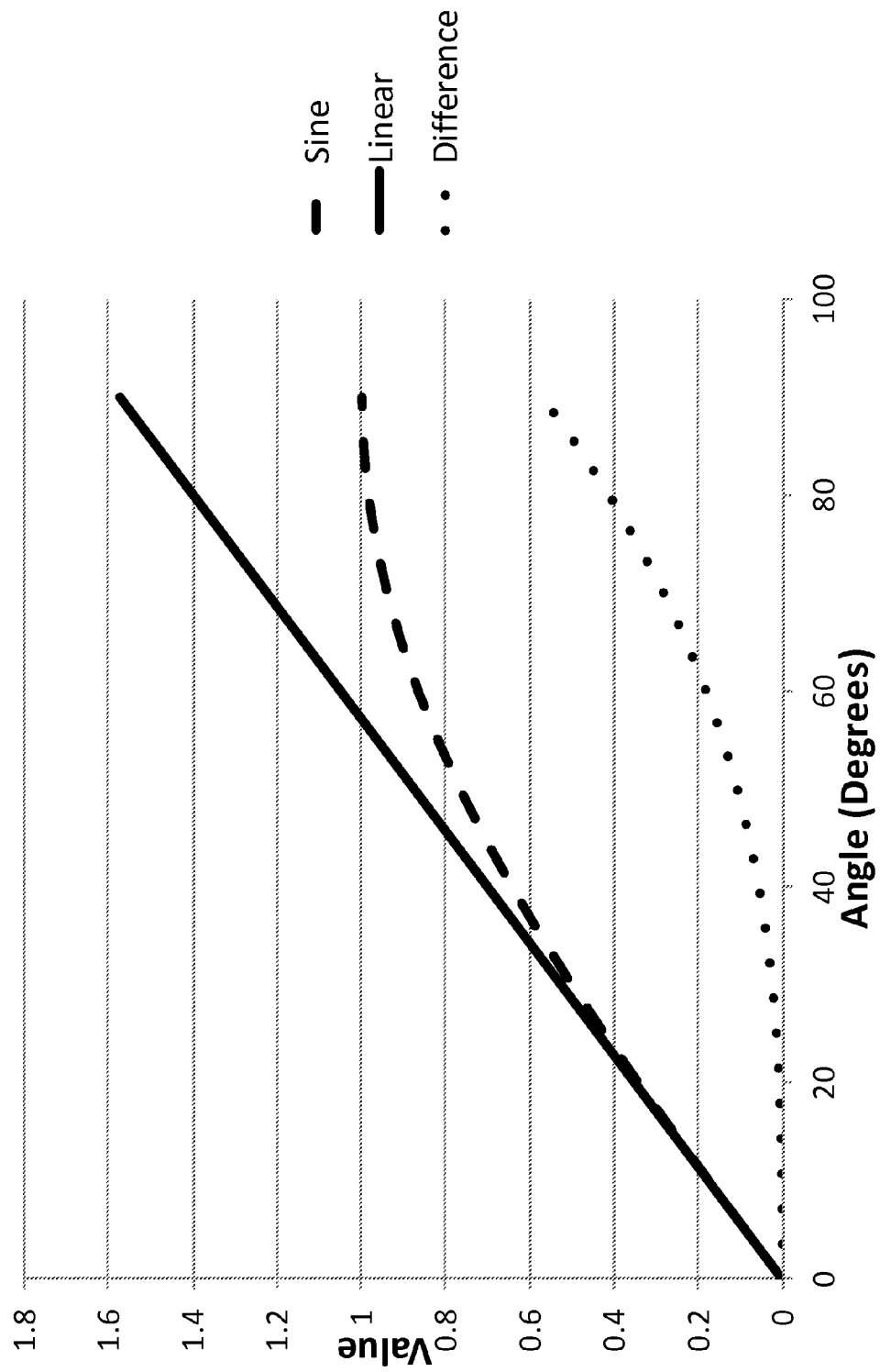
FIG. 7 is a plot of the linear to sine comparison as a function of angle, showing the ideal change in scan angle as a solid line, the sine relationship as a dashed line, and the difference as a dotted line, wherein by limiting the useful scan angle range and by carefully choosing the substrate velocity and the maximum scan amplitude, the difference over the useful scan range can be minimized.
Figure 8:
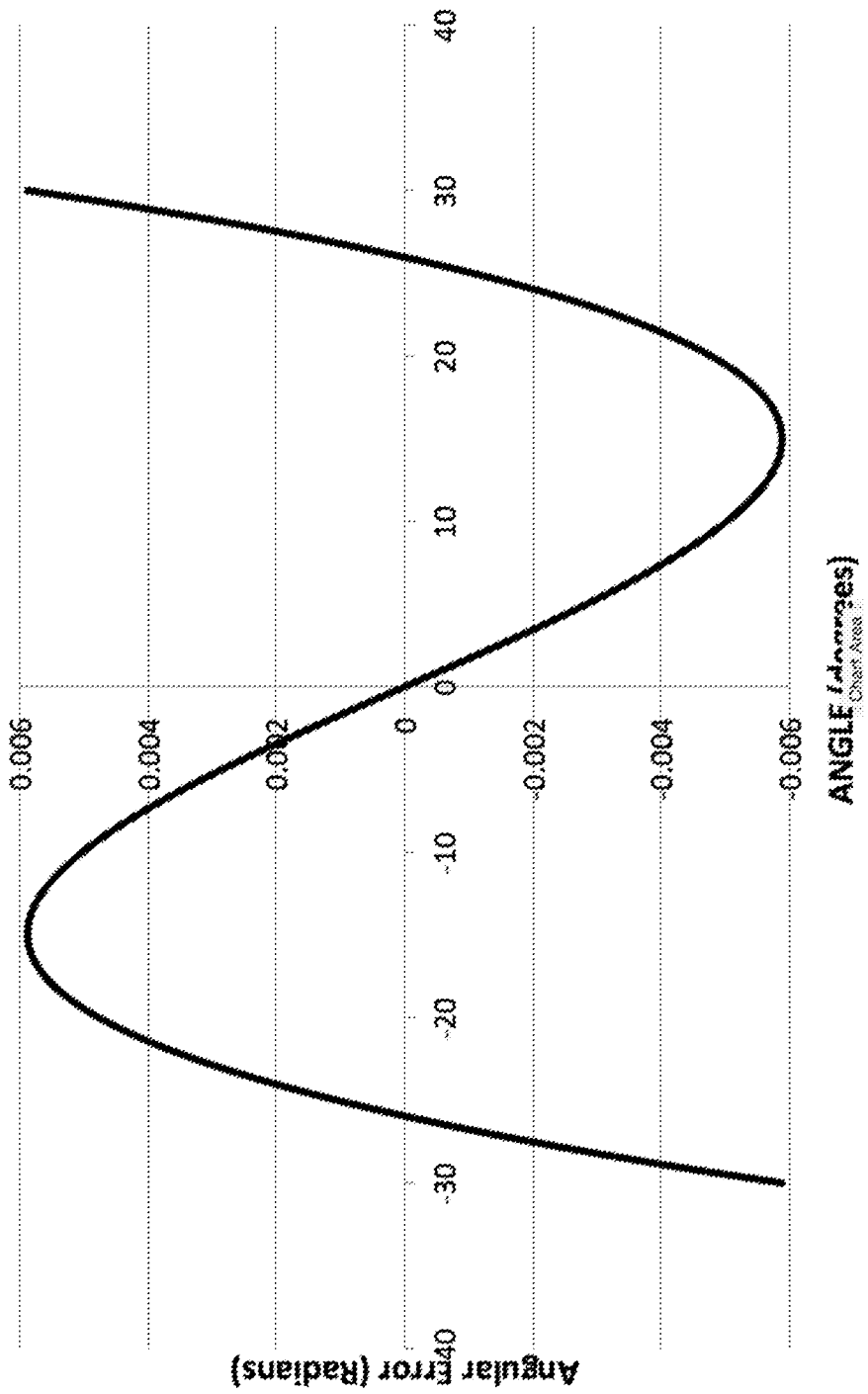
FIG. 8 is a plot of the angular error (radians) versus the angular excursion (degrees) for a +/−30 degree scan range, which is achieved by changing the slope of the linear curve of FIG. 7 to minimize the maximum angular error, wherein the angular excursion is measured assuming an entire oscillation cycle corresponds to 360°.

The scan repetition rates and frequencies discussed so far, namely 740.74 Hz and 1,111 Hz, are well beyond the capability of a raster type of scanner, but not a resonant scanner. However, a resonant scanner is limited in the angular range over which the deflection angle approximates a linear curve, as shown in the plot of FIG. 7. The linear curve FIG. 7 was chosen so that it has the same slope as the sine curve at zero degrees. By changing the slope of the linear curve, it is possible to get a much better fit, as illustrated in the balanced error curve shown in FIG. 8. In this case, the maximum angle error is 0.0059 radians over a ±0.5236 radian)(±30° scan, which corresponds to an error of ±1.127%. This error varies roughly with the square of the maximum angle. The ±30° angle is not the actual angle of rotation of the scanning mirror; it is the proportion of the total 360° resonant cycle, which is employed for actual scanning. The maximum angular rotation of the resonant mirror varies from case to case. In the remainder of the scan cycle the resonant mirror angle is poorly synchronized to the substrate motion. Thus, if only about ⅙ of the total resonant mirror cycle time is used for performing an exposure, the largest possible errors are ±1.127% of the maximum displacement, and depending on the position and duration of the exposure during the scan, the errors can much less.

Case 1—Scanning Error

In FIG. 6, where five separate exposure frames were accomplished in 225 μs, and within ⅙$^{th}$ of a single oscillation of the resonant mirror, the substrate scanning velocity was 740.74 mm/s, which corresponded to 1080 pixels in 1.35 ms. The portion of the scan cycle over which the exposure was done was ⅙ of the entire of the entire scan mirror oscillation or a total range of 180 pixels or ±90 pixels. The corresponding scan errors are shown in FIG. 6. The five "open" rectangles in FIG. 6 represent the periods during which the exposure happens and the spaces between represent the time required to change the pattern on the DMD. It is readily apparent that in 2 cases, the pixel placement error could be about 1 pixel, and the pixel smear during the 25 μs exposure could be as much as 0.85 pixels.

By simply shifting the data in the DMD by an integral number of pixels, an integral number of pixel off-sets can be accommodated, but a smear greater than about 0.3 pixels is unacceptable in many applications. Instead of keeping the exposure time constant, the intensity is kept constant and the pulse length is varied to change the dose, then it is possible to minimize the average pixel off-set and the pixel smear during each exposure. This is illustrated in FIG. 9. Note that the two longest exposures (1.0 & 0.5) are placed near the maxima and minima of the placement error curve so both of these would require shifting the data in the DMD by one pixel. The third exposure (0.25) is placed on the center of the displacement curve where the average off-set is zero and the slope is minimal compared to the other possibilities. The remaining exposures, (0.125 & 0.0625) are placed near the ends of the error curve where the average off-set is zero and the slope is extreme, but during the short exposure time the resulting smear is very small.

Case 2

By stretching the time taken to perform all five exposures shown for case 1 from 225 μs to 275 μs, it is possible to double the maximum exposure time from 25 μs to 50 μs, thereby halving the laser power required. This is illustrated in FIG. 10.

Case 3

One of many possibilities for further reducing the laser power required is to spread 5 exposures over several scan mirror oscillation cycles. For example, the largest and second largest exposures could be done in the first and second cycles and the remaining 3 exposures in the last cycle. This is illustrated in FIGS. 11 and 12. Since the entire cycle is used for the highest exposure, the scan angle has to be reduced to keep the image smear within bounds. A reduction from ±30° to ±20° reduces the maximum possible smear from ±1 pixel to ±0.3 pixels, which may or may not prove to be acceptable depending on the application. Although increasing the number of scan mirror cycles increases the total time to expose a DMD image, and therefore decreases throughput, it also decreases the laser power required to produce a nominal exposure dose (30 mJ/cm$^2$).

Performance Summary

A performance comparison of the three examples chosen to illustrate the advantages of image motion compensation is summarized in Table 2.

TABLE 2

Performance Comparison

| | | Case 1 | Case 2 | Case 3 |
|---|---|---|---|---|
| Longest Exposure Pulse | μs | 25 | 50 | 100 |
| Exposure time/oscillation | μs | 225 | 275 | 100 |
| Useful portion of Oscillation Cycle | | ⅙ | ⅙ | ⅑ |
| Oscillations/DMD Image | | 1 | 1 | 3 |
| Time/Oscillation | μs | 1350 | 1650 | 900 |
| Total Time/DMD Image | μs | 1350 | 1650 | 2700 |
| Substrate Scan Velocity | mm/s | 720 | 589.1 | 360 |
| Laser Power | W | 30 | 15 | 7.5 |
| Maximum Error/max angle | | .0113 | .0113 | .00504 |
| Max. Possible Scan Error | pixels | 1.02 | 1.02 | .3 |
| Actual Scan Error | | ~zero* | ~zero* | ~zero |
| Actual Smear | pixels | ~zero | ~zero | ±0.3 |
| Useful Scan Angle (Total) | pixels | 180 | 180 | 40 |
| Useful Scan Angle (Total) | degrees | 0.253 | 0.253 | .056 |
| Maximum Scan Angle (Total) | pixels | 360 | 360 | 117 |
| Maximum Scan Angle (Total) | degrees | 0.505 | 0.505 | 0.164 |

*After 1 pixel offset to DMD data

A Commercially Available Resonant Scanner

Case 3 requires a scanning mirror in the form of a resonant scanner operating at a frequency of 1,111 cycles/s and over a total angular range of 0.164°. If the scanning mirror is located close to the relay pupil plan (see FIG. 2D), the clear aperture of the scanning mirror is 7.724 mm diameter. Electro-Optical Products Corp., located in Fresh Meadows, N.Y., sells a resonant scanning mirror device that is 2.5 inches long and 0.692 inches by 0.942 inches that can scan a 10 by 10 mm mirror over a 20° scan angle at a resonant frequency ranging from 750 to 3500 Hz. Thus the requirement fits very easily into the off-the shelf components supplied by, for example, Electro-Optical Products Corp.

Throughput Estimate for Processing Glass Panels

A generation 8 flat glass panel is 2160 mm by 2400 mm. One way of scanning a substrate in the form of such a panel is to place two rows of columns back-to-back across the center of the substrate scanning stage 96 so as to span the 2160 panel dimension. If each column is assumed to be 60 mm wide, then 36 columns will exactly span the substrate and the second row, which is assumed to be shifted 30 mm in the cross-scan direction, will require only 35 columns.

The effective width of the DMD image is:

Column width in the cross-scan direction=(1920−31) (0.0108 mm)/12=1.7 mm

The number 31 is the number of pixels required to obtain a seamless overlap between adjacent scans. The number scans to image the complete panel is:

Number of scans=30 mm/1.7 mm=17.65=18

In order to scan the complete length of the panel, we need to add to the panel length the distance between the objectives in row 1 and row 2, which is assumed to be 60 mm. Thus the total scanning time is:

Scanning time=18(2400 mm+60 mm)/864 mm/s=51.25 s

Assuming that the substrate stage can operate at an average acceleration of 1 g, the total time spend accelerating and decelerating is given by:

Acceleration time=2(18)(864 mm/s)/(9800 mm/s$^2$)=3.174 s

Takt time=54.424 s+load & unload+alignment.

Fixed Grid Variable Dose

There are many ways of generating suitable images and for patterning a substrate using the systems and methods disclosed herein. For example, the basic pattern for a layer is usually laid out on a grid that is 5-10 times smaller than the size of a minimum feature. It is usually not practical from a throughput perspective to duplicate this grid on the DMD, which usually has much coarser grid. Multiple, identical exposures of the same part of the pattern are made as the substrate scans across the DMD image position, and the grid defining the basic pattern gradually shifts with respect to the fixed grid on the DMD pixels from one scan position to the next. A decision needs to be made on whether or not to turn on an individual DMD pixel, depending on how many on pixels in the original pattern grid fall on the DMD pixel in question. This is not the means of generating images being considered here.

In this instance, there is no gradual shift between the grid defining a point on the image and the DMD pixel grid. The shift between frames is always an integer number of DMD pixels so that the DMD pixel grid is always superimposed on the pattern grid in exactly the same place. In instances where a pattern edge passes through a DMD pixel, the exposure dose of that pixel is varied in such a way that after exposure and development, the pattern edge winds up about where the basic pattern defined it. Thus, in this scheme a fixed grid (meaning the basic pattern grid) and the DMD grids are locked together, and a variable dose is applied to each DMD pixel position to position the line edges in the exposed pattern to within a fraction of a DMD pixel.

Most modern resists have a very high gamma, meaning that the transition from no resist remaining to nearly the full thickness of resist remaining after development occurs over a very small change in exposure dose. A good approximation to the position of a developed edge can be achieved by simply following the appropriate exposure dose contour. The exposure dose defining the edge position is usually called the exposure dose threshold, and it is generally about 40% of the maximum dose.

In this instance the geometrical size of a DMD pixel on the image plane where the substrate surface resides is approximated by the pixel spacing divided by the magnification;

Geometrical Size of image pixel=10.8 µm/12=0.9 µm

Figure 13:
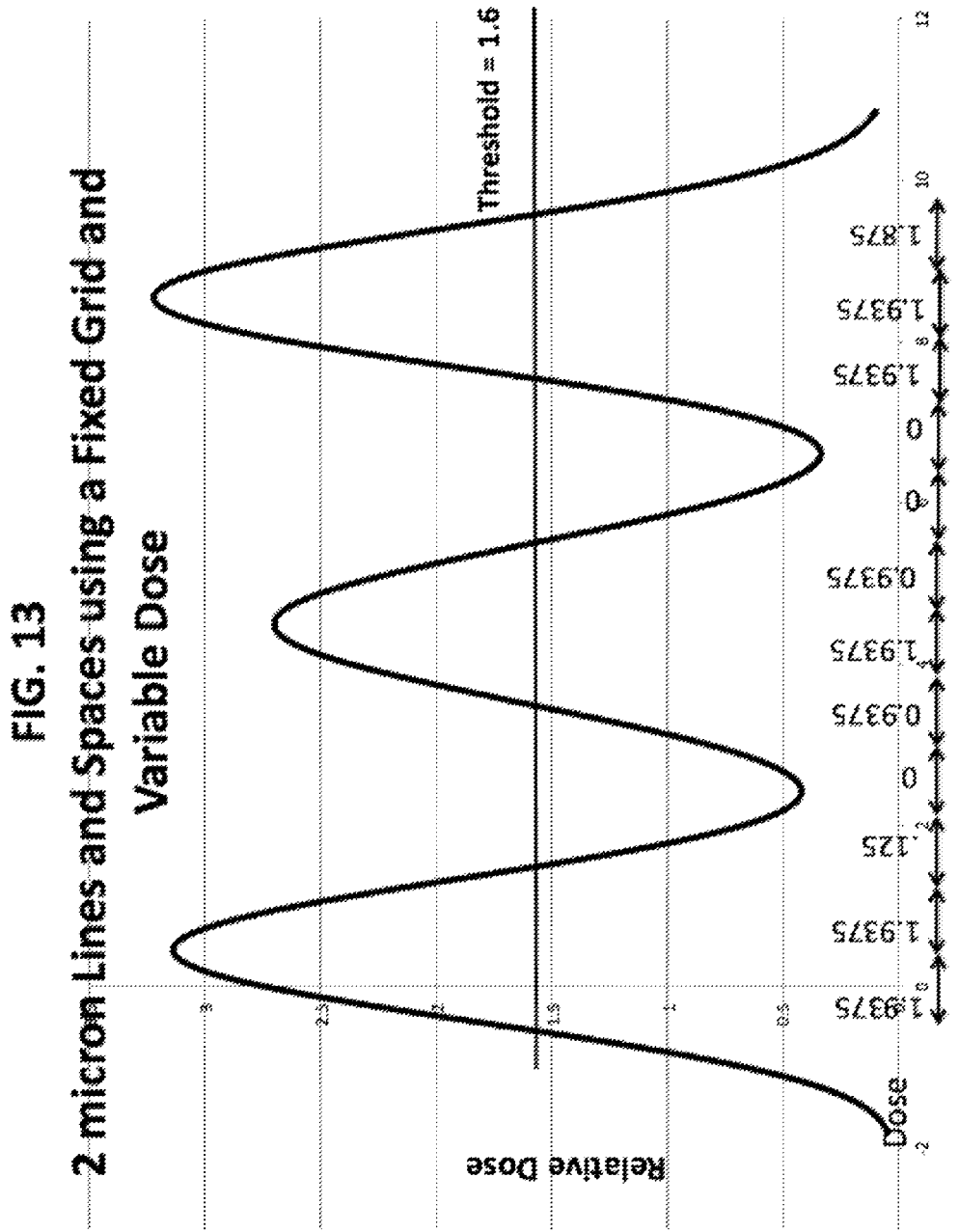
FIG. 13 is a plot of relative exposure dose versus position (microns) for imaging 2 micron lines and spaces using a fixed grid of 0.90 micron pixel images and a variable exposure dose at each pixel position.

The actual size may be slightly larger than this due to diffraction and other effects. To ensure that it is indeed possible to generate 2 µm lines and spaces with image pixels spaced 0.9 µm apart, a model containing 3 lines and two spaces was attempted and the results are shown in the plot of FIG. 13. The grid of arrows at the bottom of the plot indicate the location of the pixels composing the image and the number corresponding to each arrow is the corresponding value of the exposure dose. In this case the exposure dose threshold was set at 1.6 and at this level the threshold crossings do an acceptable job of replicating 2-micron lines and spaces. Note that the maximum resulting exposure dose corresponds to about 3.2 even though the maximum dose for an individual exposure was 1 and the accumulated dose for 5 exposures was 1.9375 (31/16). The overlap between adjacent pixels was responsible for increasing the maximum dose to about 3.2.

Illuminated Image Motion

Aspects of the disclosure restrict the illumination on the DMD to certain selected pixel rows and this illumination pattern is scanned in synchronism with the motion of the substrate, with the scanning mirror located between the illumination source and the DMD. In order to generate consistent exposure levels, each pixel row on the DMD that is scanned by the same illumination band holds identical "off" or on values. The illumination scanner is a small mirror that oscillates about an axis running parallel to the face of the mirror at a fixed, resonant frequency. As in the previous scheme, the resonant frequency is tightly controlled along with the scanning velocity. In this case only over about ¼ of the mirror oscillation time is it possible to synchronize the motion of the illuminated portions of the DMD with the motion of the stage with sufficient accuracy.

Thus, if the substrate stage moves 27 pixels between exposures, the range of motion over which synchronization is feasible is about 6 or 7 pixels, corresponding to about ±45° of the total mirror cycle of 360°. This range of motion has to include the number of identical pixels placed in a row to be scanned, which will be called N. The scanning distance has to extend from the middle of the first identical pixel to the middle of the last identical pixel or over a range of N–1 pixels.

Another important constraint is that the speed of the substrate stage and the frequency of the scanning mirror cannot be varied from one cycle to another and are synchronized and locked together. The principle behind this scheme to scan the illuminated portion of the DMD pattern is illustrated in FIG. 2C, discussed above.

An exception to the rule that each row of pixels scanned by the same illumination has to be identical is where certain pixels in a column of N pixels are deliberately turned off or on to generate an additional gray scale level.

The DMD Pattern

An example pattern to be printed on substrate 90 consists of a random appearing set of ones and zeros distributed across the entire DMD area. We wish to be able to print each pixel in this pattern with a gray scale that might be $2^{m+1}$ different levels. If m=4, then 32 different gray levels are possible, ranging from zero to 31/16 in increments of 1/16. In order to scan with a consistent exposure level, it is necessary to duplicate the information in one row over several adjacent rows. For example, if it was desired to scan a distance of 2 rows, then 3 duplicate rows capped with a blank or off row would be required for a total of 4 rows. If 4 duplicate rows capped with a blank row are required for scanning, then 5 exposures are required to supply the missing information before a scan duplicating the same portion of the pattern and the same exposure level represented in the first scan can be made.

The numerical values contained in Columns B through K of the example shown in the spread sheet in the Appendix of U.S. Provisional Patent Application Ser. No. 62/034,981 refer to a row of pixels 1920 pixels wide representing a slice through the pattern—the actual value of an individual pixel would be either a zero or one, which corresponds to the 2 possible mirror tilt directions. In the example, the substrate stage advances 54 pixels between frames and the data in the DMD advances 53 pixels three times followed by a 57 pixel advance every 4th time.

Thus the average advance of the DMD data and the substrate stage are the same (54 pixels), but the extra advance every 4th time of the DMD data represents sections of the pattern that have been printed previously. Thus the piece of the pattern represented by the number 1 and printed in substrate/DMD position 2 is duplicated in the 5th frame at DMD/substrate positions 218, 434, 650, & 866, but not in position 1082, because that exceeds the number of pixels in a DMD column.

The sequence of events shown in the Appendix of U.S. Provisional Patent Application Ser. No. 62/034,981 µs as follows:

Frame 1: Duplicate data in DMD row positions 27-29 is scanned and printed onto substrate row position 28. (Similarly duplicate data in DMD positions 23-25 is printed onto substrate position 24 and so on.)

Frame 2: The substrate has been advanced 54 pixels so that the data printed in Frame 1 on location 28 is now located on substrate position 82 and duplicate data in DMD positions 80-82 is scanned and printed onto substrate position 81 just below the previous printed data.

Frame 3: The substrate has been advanced 54 pixels so that the data printed in Frames 1 and 2 is now located onto substrate positions 135-136 and duplicate data in DMD positions 133-135 is scanned and printed onto substrate position 134 just below the previous printed data.

Frame 4: The substrate has been advanced 54 pixels so that the data printed in Frames 1-3 is now located onto substrate positions 188-190 and duplicate data in DMD positions 186-188 is scanned and printed onto substrate position 187 just below the previous printed data.

Frame 5: The substrate has been advanced 54 pixels so that the data printed in Frames 1-4 is now located onto substrate positions 241-244 and duplicate data in DMD positions 243-245 is scanned and printed onto substrate position 244, on top of the data printed in Frame 1.

Shifting the position of a scan one line below the previous lines requires that the DMD data be shifted one pixel less than the substrate is moved, and that the timing of the exposure pulse also be shifted the equivalent amount of the time. This was the case for Frames 2-4. The exception was Frame 5 in which the DMD data was shifted forward an extra 3 pixels to duplicate some of the data printed in the first frame. Following this format, some data is duplicated every fourth frame and advanced 216 pixels on both the substrate and DMD. This means that the 1080 rows of pixels in the DMD can hold 5 pieces of information representing the same line of data from the master pattern, or each of the 5 different intensity settings for that row of data.

Table 3 set forth below summarizes some of the possibilities for scanning such as scanning 1 pixel, 2 pixels, or 3 pixels and compares their relative efficiencies. The total available scan length has to include the length of scan, N−1 pixels, plus the number of scan offsets, N, required to fill in all the empty spaces between adjacent printed pixels. The only alternative is to add a raster-scanning mirror that adds the desired offset for each frame. This may be possible since the raster scanning mirror would only be required to move one or two pixels each frame and ¾ of the frame time would be available to reposition the raster mirror. The effect of this would be to make the entire useful scan length of the resonant mirror available for scanning. This would increase the scan length a little over a factor 2 from N−1 pixels to 2N−1 pixels.

Another constraint is imposed by the requirement that a gray scale is required with $2^m$ different shades. Thus if a total of 40 frames are printed while a fixed point on the substrate passes through the DMD image, and the same pixel row is printed 10 times, then each of the m+1 different intensity levels has to be equally represented by the same number of exposures at each level. For example if the scan length is 2 pixels then 3 identical rows are required plus a blank row for a total of 4 rows so the number of exposures given to a specific row is ¼ of the total number. The net result of these constraints is that the total number of exposures for any specific pattern row that moves across the DMD must be evenly divisible by M+1 where M pertains to the gray level exponent.

TABLE 3

Scanning System Parameters

| Patterned Pixels N | Scan Length N − 1 | Offset + Scan 2N − 1 | No. of Exp. Doses E | Repeat Distance (D) 1080/E(N + 1) | Relative Laser Power D(N − 1) |
|---|---|---|---|---|---|
| 2 | 1 | 3 | 5 | 72 | 72 |
| 3 | 2 | 5 | 5 | 54 | 27 |
| 4 | 3 | 7 | 5 | 43 | 14.3 |
| 3 | 2 | 5 | 6 | 45 | 22.5 |

Table 3 above shows how various combinations of the number of consecutive patterned pixels (N) and the number of available exposure doses (E) lead to different results. The scanning velocity is proportional to the pattern repeat distance (D), and the relative required laser power is proportional to the scanning velocity divided by the scan length (N−1). FIGS. 4A through 4C discussed above show the relationship between the illumination, the DMD and the resultant substrate pattern.

Scanning Velocity and Laser Power

The scanning velocity of the substrate is determined by the minimum step size between exposures divided by the minimum time for an exposure. If the scanning mirror operates at 20,000 Hz, then the minimum time for an exposure cannot be more than 25% of the total scan time because of scan linearity issues, which sets the maximum exposure time at 50 μs/4=12.5 μs. Although the average step indicated in the first line of Table 2 μs 72 pixels, which yields the following maximum scan velocity:

$$\text{Max. Scan Velocity} = (72)(.0108 \text{ mm})/((12)(50 \times 10^{-6} S)) = 1,296 \text{ mm/s}$$

$$\text{Laser Power at Substrate} = (\text{Dose})(\text{Area})/\text{Time}$$
$$= (0.03 \text{ Ws/cm}^2)(.0168 \text{ cm}^2)/$$
$$((31/16)(12.5 \times 10\text{-}6 \text{ s}))$$
$$= 20.81 \text{ W}$$

$$\text{Laser Power at Diodes} = 20.81 \text{ W}/((0.63)(0.55)) = 60 \text{ W}.$$

Scan Angles

If 2N+1 equals 5 then the maximum useful scan range is 5 pixels which corresponds to a change in mirror angle of:

Mirror Angle Change=(5 pixels)(0.00591575°/pixel)/2=0.01479°=0.0002581 radians

The mirror located at the pupil location in FIG. 2B has a clear aperture of 5.724 mm. The phase change induced at the edge of the mirror at a wavelength of 405 nm is:

Phase change=2(5.724 mm/2)(0.0002581)/0.000405 mm=3.65 λ

Laser Output Power Sequence

Figure 14:
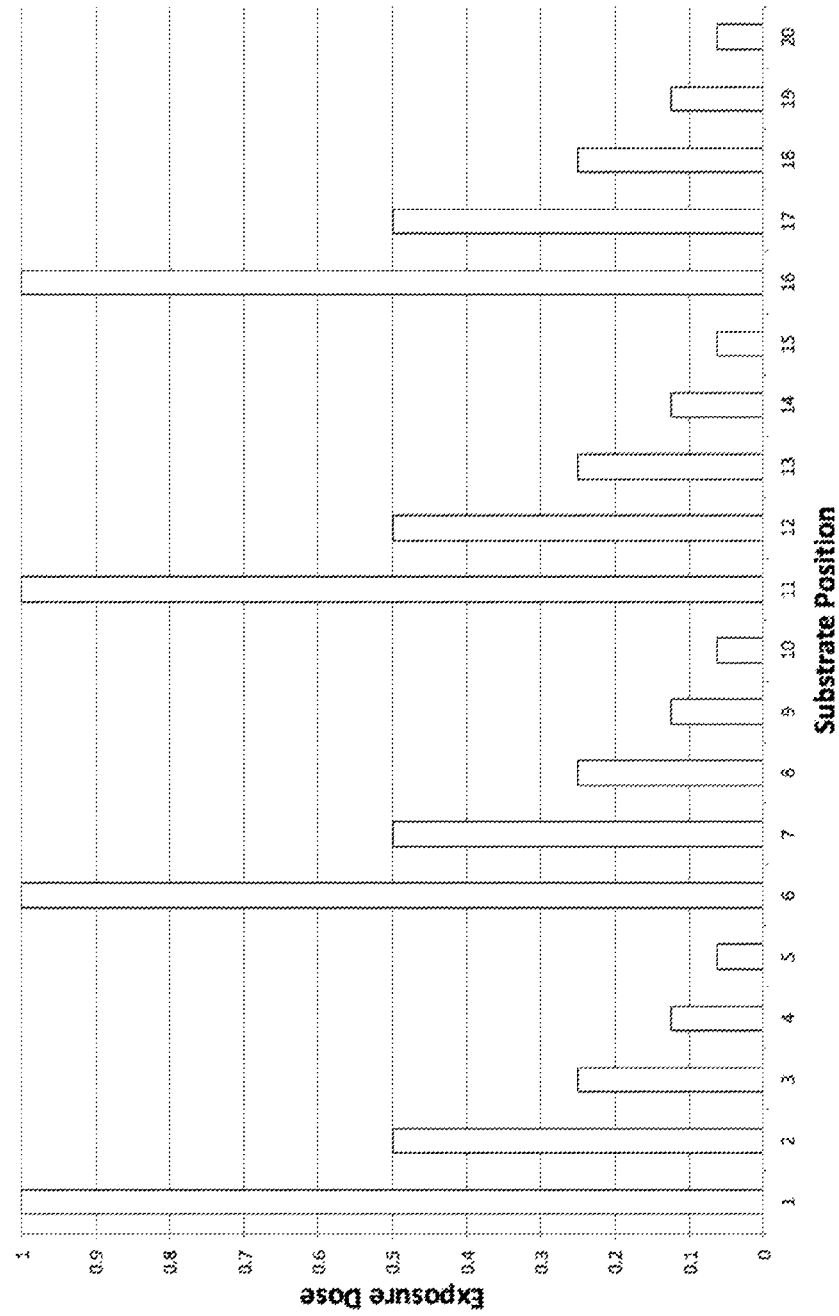
FIG. 14 is a bar graph of the exposure dose versus substrate position, illustrating an illuminator output sequence that uses five different exposure levels by cutting successive exposures in half to obtain 32 possible gray levels in five exposures.

A simple way of obtaining 32 gray levels is to cut the exposure dose in half with each successive exposure until five different exposure levels are obtained, then repeat the sequence. This is illustrated in the bar graph of FIG. 14. This can be accomplished in various ways. For example, the number of laser diodes used in the illuminator can be changed from one exposure setting to the next, or the laser power to each laser diode can be reduced, or the duration varied, or a combination of all techniques can be used. This generates a single exposure dose level ranging on a relative scale from 1 to $\frac{1}{16}$.

In the second example shown in Table 3, where N+1=4 pixels, each row of the desired pattern is displayed on the DMD every 4th exposure, but not in the same position, and the same exposure dose repeats after every 5th time. Thus after 20 exposures each of the different pattern rows has been exposed to all 5 intensity levels. In the special case where the number of intensity levels equals the number of different rows, this fortuitous circumstance breaks down and it is necessary to vary the intensity levels such as: 11111,22222,33333,44444,55555, . . . or 12345,23451, 34512,45123,51234, . . .

Gray Scale

Figure 15:
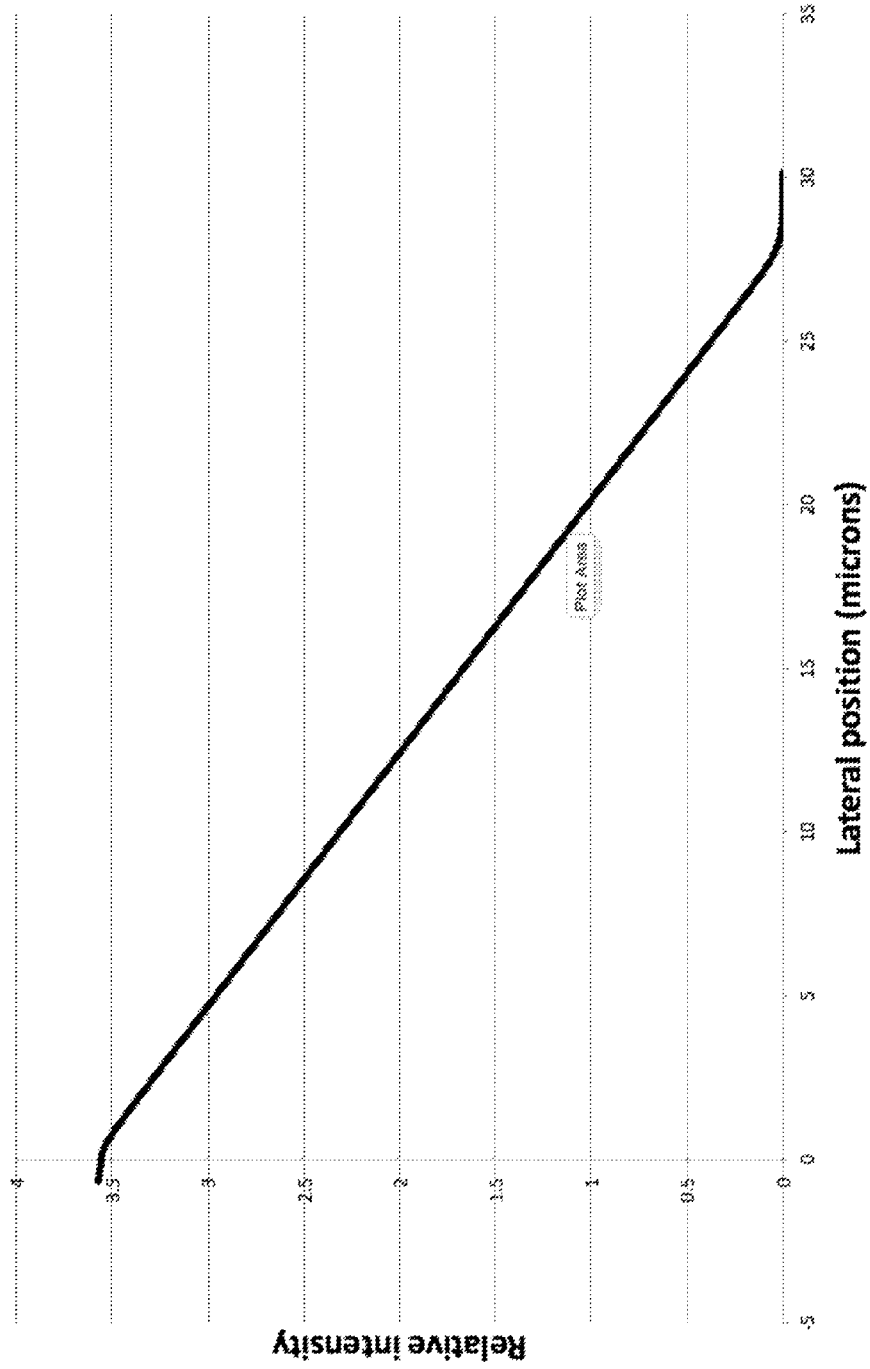
FIG. 15 is a plot of the linear relationship of the relative intensity versus lateral position (microns) that can be obtained using 32 gray levels for the exposure.

A gray scale is very useful in adjusting the position of a feature edge over a 1-pixel range. It is also very useful when it is necessary to seamlessly join a field written by one writing column with that written by another column. Any alignment error between the fields where they are simply butted together results in an easily discernable jog or change in line width, whereas the same error spread over 32 pixels in a lap joint becomes invisible to the human eye. The linearity possible with 32 gray levels is shown in FIG. 15.

There are two ways of obtaining a gray scale; varying the dose from exposure to exposure by a factor two, or varying the number of pixels that are activated, i.e., turned "on" in so-called duplicate rows that are illuminated and scanned by the same band of illumination. For example, if a total of 2 pixels are scanned, i.e. the scan proceeds from the middle of the first on-pixel to the middle of the third on-pixel, then turning either the first and third pixels off or the middle pixel off, will cut the exposure dose in half, and turning off the middle and one of the end pixels will cut the exposure dose to one quarter. If this is combined with an exposure dose that alternates from full to ⅛, then 6 exposures will yield a gray scale ranging from 1/32 to 63/32. Thus the smallest increment in dose level would be 1/63 or 1.59% and the number of exposures/DMD image length (number of frames) would be 6×4=24. This special case is shown at the bottom of Table 3.

A Commercially Available Resonant Scanner

In an example, scanning mirror 70 is a resonant scanner operating at a frequency of 16,000-20,000 cycles/s and over a total angular range of ±0.054°. If the scanning mirror is located at or near the relay pupil plane such as shown in FIG. 2B, the clear aperture of the scanning mirror is about 5.73 mm diameter. Electro-Optical Products Corp. located in Fresh Meadows, N.Y. have a fixed frequency resonant mirror device SC-30 that that can scan a 3 by 4 mm mirror over a 5° scan angle at a resonant frequency ranging from 200 to 20,000 Hz. Thus the requirement comes very close to the specification of the SC-30 resonant scanner supplied by Electro-Optical Products Corp. The mirror required is slightly larger but the angular excursion is 2 orders of magnitude smaller.

One reason for scanning the illumination rather than the image itself is because the illuminator beam can have a scanning system with less mass, a higher operating frequency and less propensity to shake the surrounding structures.

Throughput

Since both the magnification of the projection system and the DMD characteristics are identical in the examples employed for the scanned illumination and scanned DMD image embodiments, the throughputs can be compared on the basis of their maximum scanning velocities. In the scanned illumination example, the scanning velocity was 1,296 mm/s. This scan rate is proportional to the corresponding frame rates of 20,000 frames/s. The various possibilities for exposing a Generation 8 panel are given below in Table 4:

TABLE 4

Exposure Time for a Generation 8 Panel

| Technology | Velocity | Scan time | Accel/decel time | Total time |
| --- | --- | --- | --- | --- |
| Scanned DMD | 740.74 mm/s | 59.778 s | 2.721 s | 62.499 s |
| Scanned Illum. | 1,296 mm/s | 34.167 s | 4.761 s | 38.928 s |

Multiple Column Constraints

A consideration when designing a multiple column configuration having some sort of motion compensation is that the stage velocity will be common to all the columns and therefore the resonant frequencies of every scanner will have to be the same. If a separate computer is used to drive the data delivery to the DMD in each column it is not necessary that the phases of each resonant mirror be locked together. Typically a resonant mirror is a very high Q device that is very difficult to tune using mechanical adjustments. Thus fine-tuning may require an advanced technique such as ablation of the edge of the resonant mirror using a small, pulsed laser to bring the resonant frequency within specification. Fine-tuning may also require a torsion bar material having a shear modulus that is relatively insensitive to temperature and a constant temperature environment.

Electro-Optical Scanning

An alternate method of scanning the DMD beam is to place an electro-optical scanner in the pupil of the projection system between the DMD and the scanned substrate. These devices include Kerr and Pockels cells which typically use crystalline materials having modest electro-optical coefficients that require voltages in the kilovolt range to produce a half wavelength shift between the two orthogonal polarizations.

Quite recently the Fraunhofer Institute for Photonic Microsystems has announced a new, nematic liquid crystal material having a very large electro-optical constant that operates just above its nematic-isotropic phase transition, and which is useable down to 400 nm. In this case the electro-optical Kerr coefficient is about $10^{-10}$ m/V$^2$ and an electric field of a few V/μm can give rise to anisotropies in the order of $\Delta n < 10^{-3}$. Thus a 0.405 mm long path could generate a phase shift of about 1λ at a wavelength of 405 nm.

The purpose of the resonant mirror in the illumination scanner was to scan an illumination pattern that illuminated about every 4th row of the DMD pixels over a scanning range of 5 pixels, including the scan and the off-set angles. This required a tilt of 0.002958°/pixel for a mirror located in the pupil of the 1:1 illumination relay. Tilting a mirror simply changes the phase relationships between the electromagnetic waves reflected by the mirror, so the mirror could be replaced with a phase-shifting device that induces a phase shift proportional to the distance from the mirror scan axis. The maximum phase change occurs at the aperture edge furthest way from the scan axis and is doubled with a reflection: Thus the maximum phase change corresponded to:

$$\text{Maximum phase change} =$$
$$\pm(2)(5 \text{ pixels})(.002958°/\text{pixel})(\pi/180)(2.864 \text{ mm}) =$$
$$\pm.00148 \text{ mm} = \pm 3.65 \lambda$$

Using the new Fraunhofer material, this phase change could be accomplished with a path about 2(0.405 mm/λ) (3.65λ)=2.957 mm.

Fortunately, a simple regular illumination pattern, such as an array of illuminated strips one unit wide separated by 3 units, contains only a few spatial frequencies, and therefore generates only a few isolated strips of light in the illumination pupil. This makes it feasible to fashion an electro-optical scanner that operates at 4 or 6 points in the aperture to scan the illumination pattern. Such a scanner would have a servo bandwidth of about a MHz, which would eliminate any dead time associated with the scanner and any problems associated with synchronization of multiple columns.

Figure 16:
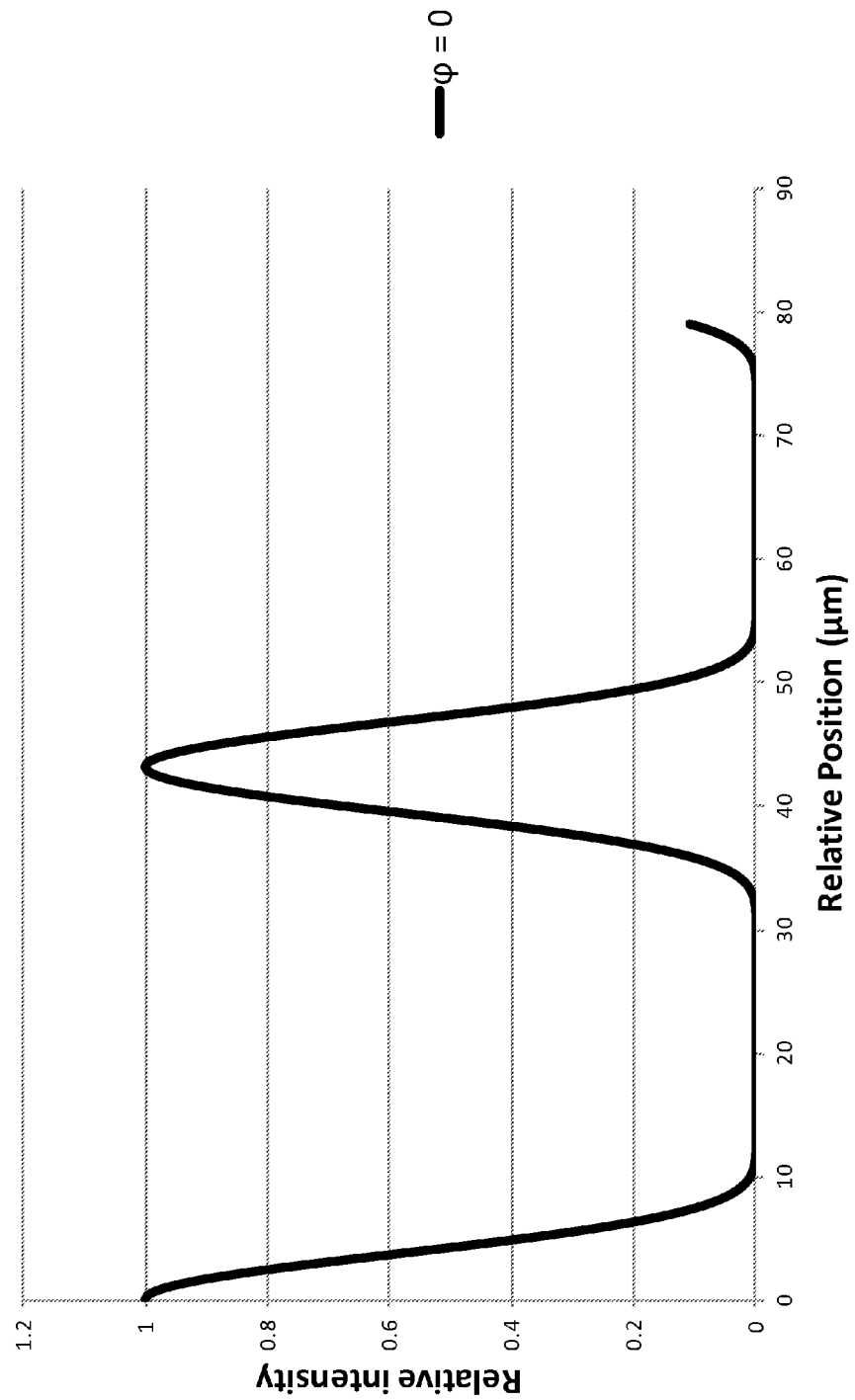
FIG. 16 is a plot of the relative intensity versus the relative position (μm) for a slit image profile with a zero phase difference between the frequency components.

The illumination angles, $\theta_n$ required to generate the desired illumination pattern of the DMD are given by:

$$\sin(\theta_n) = n\lambda/d \quad (2)$$

where $\theta_n$ is the incidence angle on the object on which the pattern is being created
  n is an integer describing the interference order (0, ±1, ±2, ±3, ...)
  λ is the wavelength (0.405 microns)
  d is the spacing between the illuminated rows of pixels (4*10.8 microns=43.2 microns)
The resultant distribution of energy, E(x), is given by:

$$E(x) = (1 + 2A_1 \cos(2\pi x/d) + 2A_2 \cos(4\pi x/d) + 2A_3 \cos(6\pi x/d))^2 / 13.0453529 \quad (3)$$

where $A_n = (\sin(n\pi s/d)/n\pi s/d)^2 = (\sin(n\pi/4)/n\pi/4)^2$
and x=lateral position in the image plane of the illuminated pattern In Equation 3, the negative orders are accounted for by using a cosine series, which is symmetrical about zero, and by the factor of 2 that precedes the $A_n$ coefficients. The last term, 13.0453529, is simply a normalization factor. The resulting slit image profile predicted by equation 3 µs shown in FIG. 16.

Figure 17:
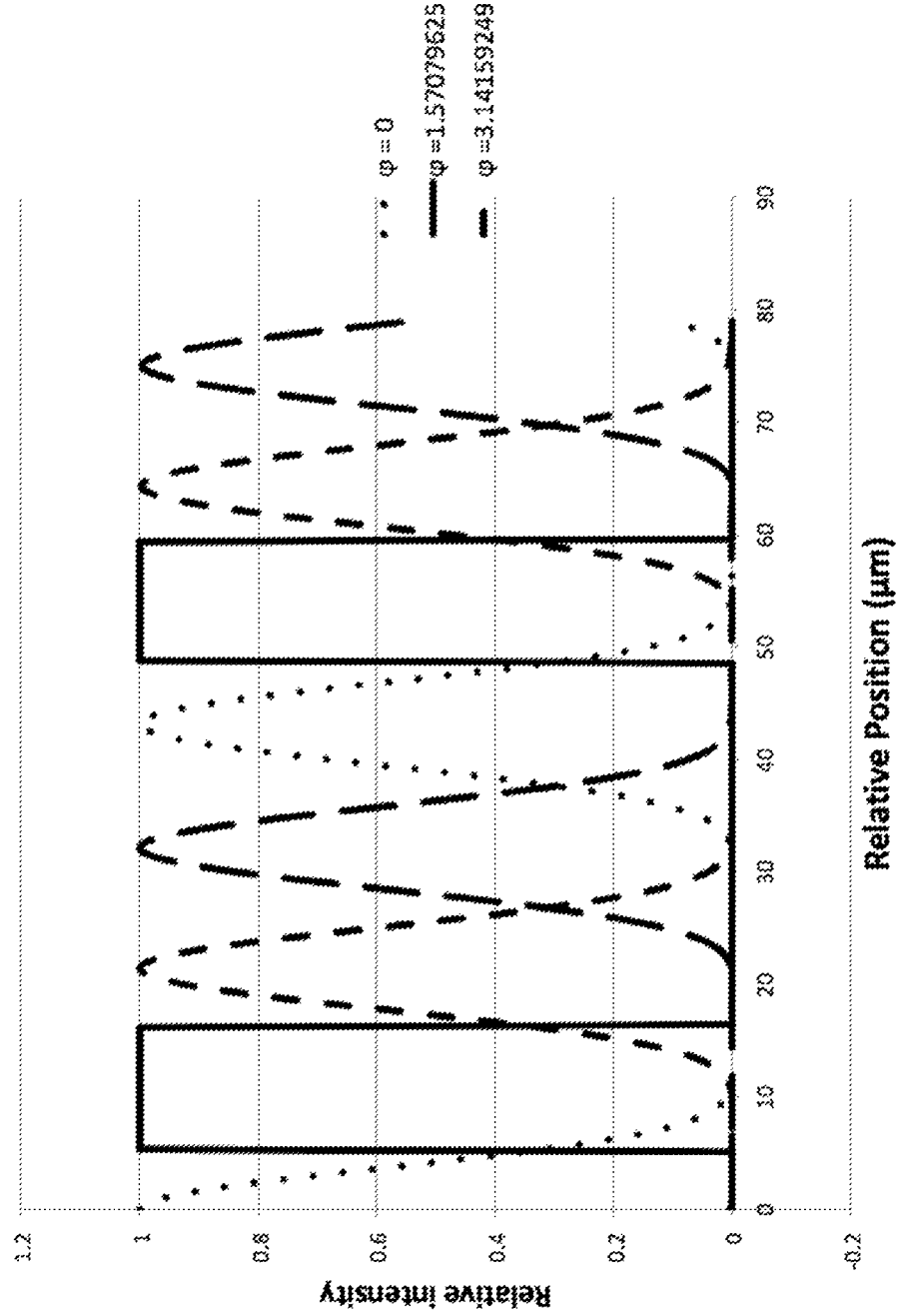
FIG. 17 is similar to FIG. 16 but showing examples where a change in phase as a linear function of the frequency component changes the illumination position.

If a phase shift proportional to the diffraction order is introduced then the position of the illuminated slit shifts laterally in the image plane as shown in FIG. 17. The phase shifts, ϕ, shown in the data labels were applied to the first diffraction order and multiples of this shift were applied to the higher orders. In this case the equation describing the phase-shifted position becomes:

$$E(x) = (1 + 2A_1 \cos(2\pi x/d + \phi) + 2A_2 \cos(4\pi x/d + 2\phi) + 2A_3 \cos(6\pi x/d + 3\phi))^2 / 13.0453529 \quad (3)$$

The solid black curve in FIG. 17 indicates the presence of an "off" row of pixels. The remaining 3 curves indicate the range of positions of the illuminated slit as it scans over a 2-pixel range because of the phase changes introduced in the pupil location. The zero order requires no phase change, the first orders a total phase change of ±π radians, the second orders a total phase change of ±2π radians and the third orders a phase change of ±π radians.

Although each scan covered a range of 2-pixels, in order to avoid putting one scan on top another it was necessary to have a total scan range of 5 pixels. This would require that the total phase shift in the third order was 7.5π radians. A phase change of ±7.5π radians corresponds to a change equal to 3.75λ and would require a path length of about 1.52 mm in the new Fraunhofer phase shift material.

The intensity distribution in the pupil plane, E(p), is given by the following equation:

$$E(p) = (\sin(Nkdp/2)/\sin(kdp/2))^2 (\sin(ksp/2)/ksp/2)^2 \quad (4)$$

where N is the total number of illuminated slits (1080/4=270)
  $k = 2\pi/\lambda (15.514 \, \mu m^{-1})$
  p is the sine of the angle of the incident light (Angular Position)
  s is the width of a pixel (10.8 µm)

Figure 18:
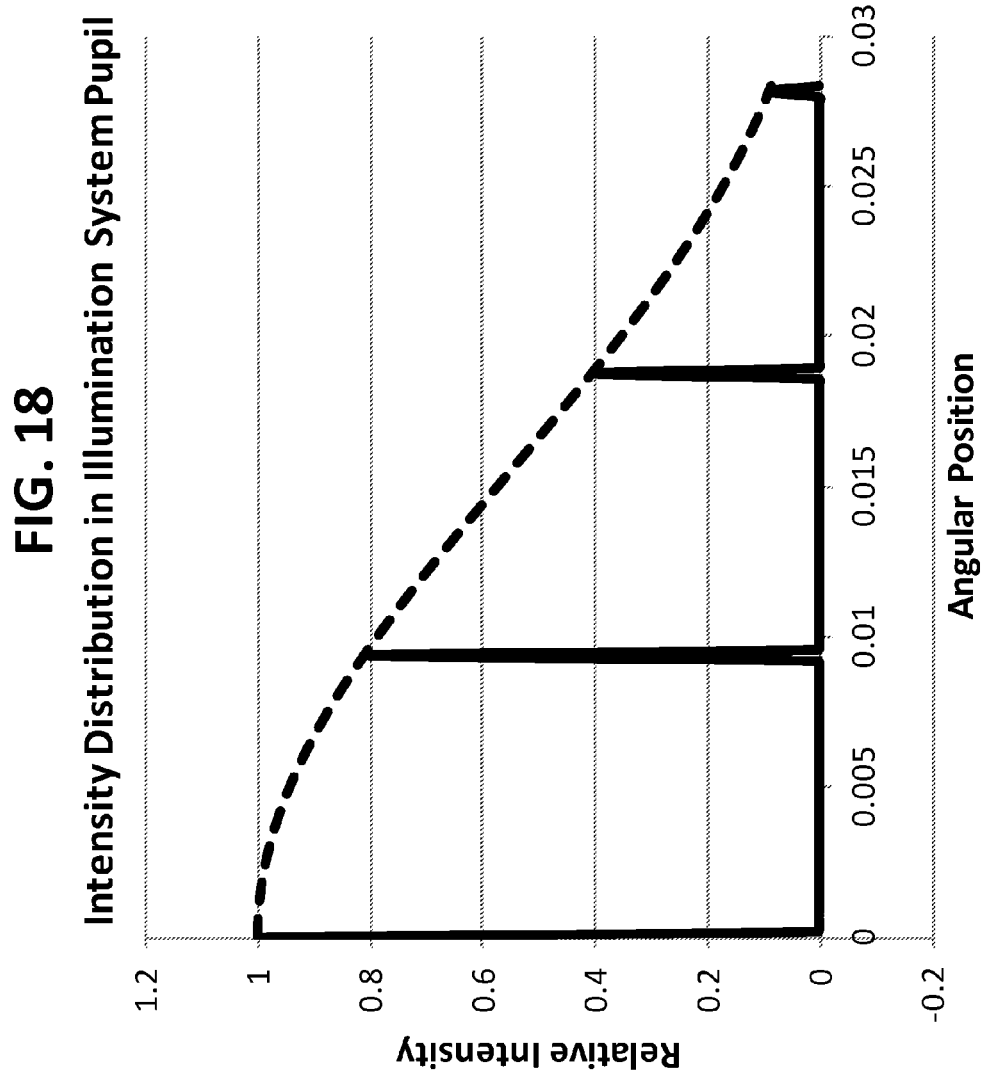
FIG. 18 is a plot of the relative intensity versus angular position, showing the intensity distribution in the pupil of the imaging system and also showing the intensity envelope (dashed line)

The first squared term in equation 4 describes the angular position and the intensity profile of each order, and the second term generates an envelope that provides the intensity of each diffracted order. FIG. 18 shows only the positive orders, however there are symmetrically positioned negative orders of equal amplitude on the opposite side of the axis. Note that the amplitude of the third diffraction order is very small compared to the first order (~9%) and might be eliminated in many cases with very little effect on the resulting beam profile shown in FIG. 15.

A Parallel Channel Kerr Cell

Figure 19:
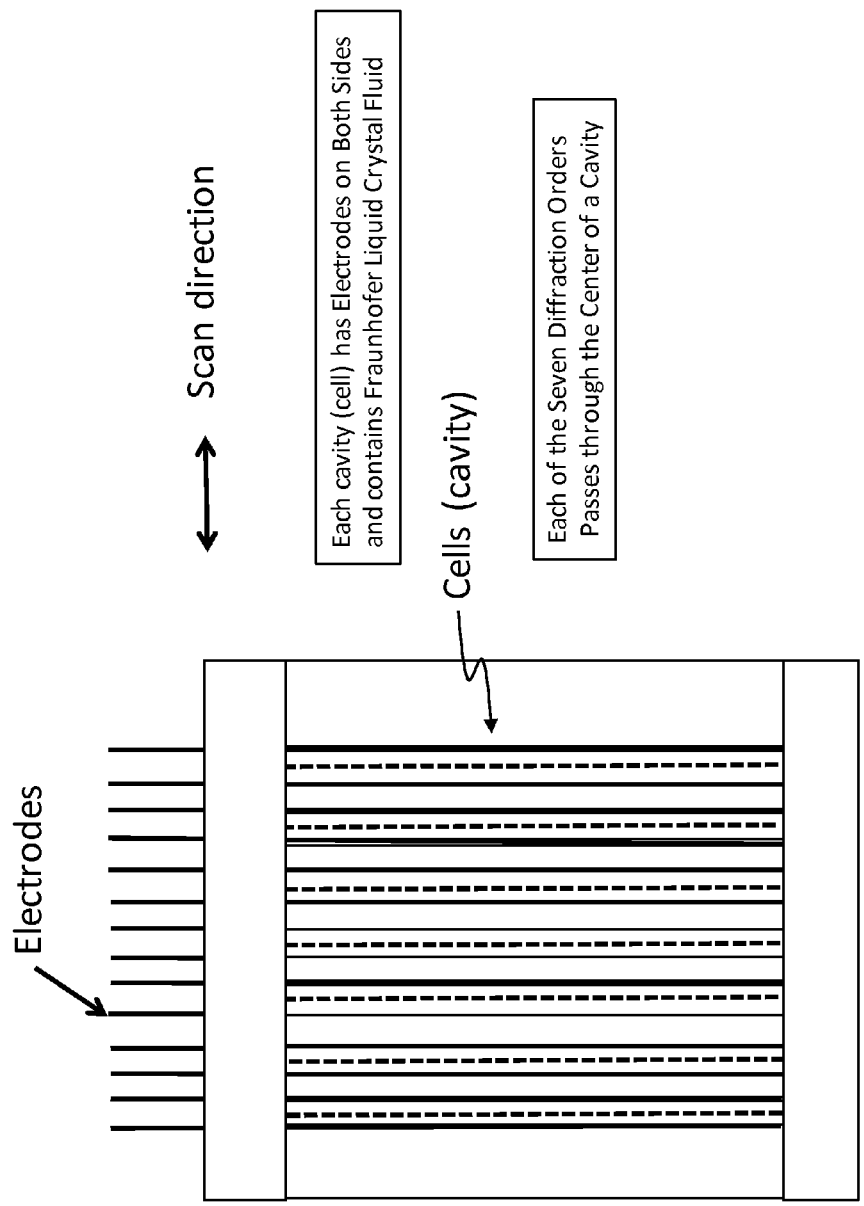
FIG. 19 is a schematic diagram of parallel Kerr cells adapted for scanning, showing the scan direction and each of the seven diffraction orders passing through a corresponding cavity of the Kerr cell.

A schematic of a Kerr cell that employs the Fraunhofer liquid crystal material is shown in FIG. 19. In this example 7 long, narrow beams, each associated with a diffraction order ranging from +3 to −3, pass through a cell containing about a 1.6 mm depth of the liquid crystal material. These beams are generated by the double-telecentric relay. Since the scanning beam is patterned in only one direction, the orders are concentrated into lines. Parallel electrodes separated by about 35 microns are arranged to produce an electric field through the portion of the cell occupied by each beam and this electric field induces a change in refractive index that causes the phase of the beam exiting the cell to be shifted. Appropriate phase shifts, described above, cause the illuminated pattern on the DMD to be shifted and to be scanned in synchronism with the substrate. In FIG. 19, the light propagation direction is into the page and the depth of each cell is in the same direction. The scan direction is horizontal.

Most Kerr cells require that the input radiation be polarized but this requirement is not made clear in the Fraunhofer material available so far. Apparently there is an electro-optical device employing this material that does not require polarized light. In the event polarized light was required a different light source might be indicated such as a frequency tripled Neodymium Yag laser, which operates at 355 nm. At least 20 W of power is commercially available from a single mode, polarized laser.

Throughput, Scanning Velocity and Laser Power Estimates

An advantage of electro-optical scanning is that it can be made sufficiently fast that no time is wasted between exposures. Thus 5 exposures can be made as fast as the DMD can be loaded or in 250 µs. The resulting scan speed is the width of the DMD image on the substrate divided by the total exposure time:

$$\text{Maximum scan speed} = (.01080 \text{ mm/pixel})(1080 \text{ pixels}) / ((12)(250 \times 10^{-6} \text{ s}))$$

$$= 3,888 \text{ mm/s}$$

The laser power required at the substrate is determined by the need to perform the largest exposure dose in 25 µs. The resulting substrate power is therefor:

$$\text{Laser Power at Substrate} = (\text{Dose})(\text{Area})/\text{Time}$$
$$= (0.03 \text{ Ws/cm}^2)(.0168 \text{ cm}^2)/$$
$$((31/16)(25 \times 10\text{-}6 \text{ s}))$$
$$= 10.4 \text{ W}$$

$$\text{Laser Power at Diodes} = 10.4 \text{ W}/((0.63)(0.55)) = 30 \text{ W}$$

In this case it is easy to extend the maximum exposure time while cutting the scan velocity marginally. For example the time for the maximum exposure time could be doubled to 50 µs while extending the exposure time per DMD image width from 250 µs to 275 µs, This would cut the scanning velocity to 3,534.5 mm/s and the laser power required at the diodes to 15 W. Doubling the maximum exposure time again to 100 µs would extend the exposure time per DMD image width to 350 µs and cut the scanning velocity to 2,777.1 mm/s and halve the laser diode power to 7.5 W.

The scanning time for the last velocity estimate would be as follows for a Generation 8 panel:

$$\text{Scanning time} = (18 \text{ scans})((2400 \text{ mm} + 60 \text{ mm})/2777.1 \text{ mm/s} = 15.94 \text{ s}$$

$$\text{Acceleration time} = 2(18)(2777.1)/(9800 \text{ mm/s}^2) = 10.2 \text{ s}$$

$$\text{Total time} = 15.94 \text{ s} + 10.2 \text{ s} = 26.14 \text{ s}$$

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. A maskless method of printing patterns in a photoresist layer on a moving substrate, comprising:
   a) illuminating an image transducer with illumination light that defines one or more exposure doses to form patterned light using an array of configurable pixels of the image transducer that define a moving image-transducer pattern;
   b) reflecting the patterned light from a resonant scanning mirror to an objective lens to form an exposure pattern in the photoresist layer at a select position relative to an existing exposure pattern based on the one or more exposure doses; and
   c) scanning the resonant scanning mirror to scan the patterned light while synchronizing the moving of the image-transducer pattern with the moving of the substrate during the one or more exposure doses such that the exposure pattern has an amount of smearing that is one third of a pixel image or less, wherein the resonant scanning mirror has an oscillation angle that varies as a sinusoid over an angular range, and including limiting the angular range used for the one or more exposure doses to a substantially linear regime of the sinusoid so that the select position of the exposure pattern formed in the photoresist layer varies linearly with the oscillation angle and with time.

2. The maskless method of claim 1, wherein in act b) the select position has a positional error equal to an integral number of pixel images plus or minus one-fifth of a pixel image or less.

3. The maskless method of claim 1, wherein the exposure pattern has at least one edge, wherein the one or more exposure doses are performed to place the at least one edge of the exposure pattern at the select position.

4. The maskless method according to claim 3, wherein the resonant scanning mirror has a scanning error curve that relates an error in the position of the exposure pattern to an angle of the scanning mirror, and wherein the one or more exposure doses are performed during at least one zero crossing in the scanning error curve.

5. The maskless method according to claim 1, wherein the one or more exposure doses comprises multiple exposure doses having exposure dose levels wherein adjacent exposure dose levels differ by a factor of 2.

6. The maskless method according to claim 1, wherein illuminating the image transducer includes relaying the illumination light from an illuminator to the image transducer using a relay optical system.

7. The maskless method according to claim 1, wherein the image transducer includes a digital mirror device.

8. A maskless method of printing an exposure pattern in a photoresist layer on a moving substrate, comprising:
   reflecting bands of illumination light from a scanning device to an image transducer to form scanned patterned bands of illumination light, wherein the scanning device undergoes angular movement;
   wherein the image transducer includes an array of configurable pixels that form transducer patterns, and wherein the scanned bands of illumination light simultaneously illuminate two or more identical rows of transducer pixels to form scanned patterned bands of light; and
   forming images of the scanned patterned bands of light onto the photoresist layer of the moving substrate using an objective lens to form an exposure pattern at a select position in the photoresist layer, including synchronizing: a) the angular movement of resonant scanning mirror, b) the substrate movement and c) the formation of transducer patterns, so that the exposure pattern has an amount of smearing that is one third of a pixel image or less.

9. The maskless method of claim 8, wherein the pixels of the image transducer are arranged in rows, and wherein the bands of illumination light illuminate rows that are evenly spaced apart.

10. The maskless method of claim 8, wherein the exposure pattern is formed by multiple exposures having different dose levels that are used to generate an accumulated exposure dose that varies with position on the substrate.

11. The maskless method of claim 8, wherein the bands of illumination light are defined by an array of cylindrical lens elements.

12. The maskless method of claim 8, wherein the image transducer includes a digital mirror device.

13. The maskless method of claim 8, wherein the scanning device comprises a resonant scanning mirror arranged substantially at a pupil plane of a 1:1 doubly telecentric optical relay system.

14. The maskless method of claim 10, wherein the array of configurable pixels in the image transducer includes columns of pixels, and wherein the multiple exposures having different dose levels are generated by using a combination of different activated pixels in a column scanned by the same band of light and by different dose levels delivered by the illumination system.

15. A maskless method of printing patterns in a photoresist layer on a moving substrate, comprising:

a) illuminating an image transducer with illumination light that defines one or more exposure doses to form patterned light using an array of configurable pixels of the image transducer that define a moving image-transducer pattern;

b) reflecting the patterned light from a resonant scanning mirror to an objective lens to form an exposure pattern in the photoresist layer at a select position relative to an existing exposure pattern based on the one or more exposure doses, wherein the exposure pattern has at least one edge and wherein the one or more exposure doses are performed to place the at least one edge of the exposure pattern at the select position; and c) scanning the resonant scanning mirror to scan the patterned light while synchronizing the moving of the image-transducer pattern with the moving of the substrate during the one or more exposure doses such that the exposure pattern has an amount of smearing that is one third of a pixel image or less, wherein the resonant scanning mirror has a scanning error curve that relates an error in the position of the exposure pattern to an angle of the scanning mirror, and wherein the one or more exposure doses are performed during at least one zero crossing in the scanning error curve.

16. The maskless method of claim 15, wherein the configurable pixels of the image transducer are arranged in rows, and wherein the illumination light comprises bands of illumination light that illuminate select rows of the configurable pixels, wherein the select rows are evenly spaced apart.

17. The maskless method of claim 16, wherein the bands of illumination light are defined by an array of cylindrical lens elements.

18. The maskless method of claim 15, wherein the exposure pattern is formed by multiple exposures having different dose levels that are used to generate an accumulated exposure dose that varies with position on the substrate.

19. The maskless method of claim 15, wherein the image transducer comprises a digital mirror device.

20. The maskless method according to claim 15, wherein illuminating the image transducer includes relaying the illumination light from an illuminator to the image transducer using a relay optical system.

21. The maskless method of claim 20, wherein the resonant scanning mirror is arranged substantially at a pupil plane the relay optical system.

\* \* \* \* \*